United States Patent
Conte et al.

(10) Patent No.: US 8,482,342 B2
(45) Date of Patent: Jul. 9, 2013

(54) CIRCUIT FOR GENERATING A REFERENCE VOLTAGE WITH COMPENSATION OF THE OFFSET VOLTAGE

(75) Inventors: Antonino Conte, Trimestieri Etneo (IT); Mario Micciche, Agrigento (IT); Maria Giaquinta, Catania (IT); Rosario Roberto Grasso, Acicastello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 11 days.

(21) Appl. No.: 12/913,682

(22) Filed: Oct. 27, 2010

(65) Prior Publication Data

US 2011/0102049 A1     May 5, 2011

(30) Foreign Application Priority Data

Oct. 30, 2009    (IT) .............................. MI2009A1897

(51) Int. Cl.
*G05F 1/567* (2006.01)
*G05F 1/575* (2006.01)
*H03F 1/30* (2006.01)
*H03L 5/00* (2006.01)

(52) U.S. Cl.
USPC ............ 327/539; 327/541; 323/313; 323/316

(58) Field of Classification Search
None
See application file for complete search history.

(56) References Cited

U.S. PATENT DOCUMENTS

| | | | |
|---|---|---|---|
| 4,883,987 A | 11/1989 | Fattaruso | |
| 6,275,098 B1 * | 8/2001 | Uehara et al. | ................. 327/539 |
| 6,529,066 B1 | 3/2003 | Guenot et al. | |
| 6,853,238 B1 | 2/2005 | Dempsey et al. | |
| 7,113,025 B2 * | 9/2006 | Washburn | ...................... 327/539 |
| 7,164,260 B2 | 1/2007 | Neaves | |
| 7,342,390 B2 | 3/2008 | Tachibana et al. | |
| 7,777,558 B2 * | 8/2010 | Chen | .............................. 327/539 |
| 7,839,202 B2 * | 11/2010 | Sengupta et al. | ............. 327/539 |
| 7,961,041 B2 * | 6/2011 | Motz | .................................. 330/9 |
| 8,031,001 B2 * | 10/2011 | Ide | .................................. 330/259 |
| 8,058,863 B2 * | 11/2011 | Cho et al. | ...................... 323/316 |
| 2006/0043957 A1 * | 3/2006 | Carvalho | ....................... 323/313 |
| 2011/0102058 A1 | 5/2011 | Conte et al. | |

FOREIGN PATENT DOCUMENTS

| | | |
|---|---|---|
| EP | 0638996 | 2/1995 |
| WO | 95/30271 | 11/1995 |
| WO | 98/42072 | 9/1998 |

OTHER PUBLICATIONS

European Search Report for Application No. EP10189494, European Patent Office, Mar. 8, 2011, pp. 2.
European Search Report for Application No. EP10189487, European Patent Office, Mar. 8, 2011, pp. 3.

(Continued)

*Primary Examiner* — Lincoln Donovan
*Assistant Examiner* — Terry L Englund
(74) *Attorney, Agent, or Firm* — Graybeal Jackson LLP

(57) ABSTRACT

An embodiment of a circuit includes first and second branches, an amplifier, a compensation circuit, and a bias unit. The first and second branches are respectively operable to generate first and second currents. The amplifier has a first amplifier input node coupled to the first branch, a second amplifier input node coupled to the second branch, an amplifier output node coupled to the first and second branches, and a first compensation node. The compensation unit is operable to provide a first offset-compensation signal to the first compensation node. And the first bias unit is operable to provide first and second bias signals to the first and second input nodes, respectively, such that the amplifier is operable to cause the first current to approximately equal the second current.

32 Claims, 11 Drawing Sheets

OTHER PUBLICATIONS

Search Report based on Italian Application Serial No. MI20091897, Ministero dello Sviluppo Economico, Jun. 18, 2010, pp. 4.

Amer Hani Atrash and Arlo Aude: "A Bandgap reference circuit utilizing switching to reduce offsets and a novel technique for leakage current compensation" Circuits and Systems, 2004. NEWCAS 2004. The 2nd Annual IEEE Northeast Workshop on Montreal, Canada Jun. 20-23, 2004, pp. 297-300, XP010742514.

Christian C Enz et al: "Circuit Techniques for Reducing the Effects of Op-Amp Imperfections: Autozeroing, Correlated Double Sampling, and Chopper Stabilization" Proceedings of the IEEE, IEEE. New York, US, vol. 84, No. 11, Nov. 1, 1996, pp. 1584-1614 XP011043780.

Search Report based on Italian Application Serial No. MI20091898, Ministero dello Sviluppo Economico, Jun. 18, 2010, pp. 3.

* cited by examiner

CIRCUIT FOR GENERATING A REFERENCE VOLTAGE WITH COMPENSATION OF THE OFFSET VOLTAGE

PRIORITY CLAIM

The instant application claims priority to Italian Patent Application No. MI2009A001897, filed Oct. 30, 2009, which application is incorporated herein by reference in its entirety.

RELATED APPLICATION DATA

This application is related to U.S. patent application Ser. No. 12/913,682, entitled CIRCUIT FOR GENERATING A REFERENCE VOLTAGE filed Oct. 27, 2010, and which is incorporated herein by reference in its entirety.

TECHNICAL FIELD

An embodiment relates to a circuit for generating a reference voltage. In particular, an embodiment relates to a circuit for generating a reference voltage of the bandgap type.

BACKGROUND

Circuits for generating a reference voltage, also known simply by the term "voltage reference circuits", are circuits that may play a vital role in various types of integrated circuits. In particular, a voltage reference circuit may be capable of generating at least one electrical quantity with high accuracy and great stability, which quantity may be used as reference in various types of circuit blocks such as analog to digital converters, voltage regulators, measuring circuits and so on. A voltage reference circuit may, therefore, be provided with specific features such as good thermal stability and good electrical noise rejection, so as to be capable of providing an output voltage whose value is more independent as possible from voltage supply variations and from temperature changes of the circuit wherein it is integrated.

A class of voltage reference circuits widely known, that is, with the features mentioned above, is the so-called bandgap voltage reference circuits class, or simply bandgap circuits. Briefly, a bandgap circuit exploits the band potential of silicon to generate an accurate reference voltage that is independent of the circuit operating temperature. The operation principle of a bandgap circuit is based on obtaining a bandgap voltage VBG (almost) independent of the circuit operating temperature by means of a bipolar transistor that implements the relation VBG=VBE+nVT, where VBE is the voltage between the base terminal and the emitter terminal of the bipolar transistor, VT is the thermal voltage (equal to kT/q, where k is the Boltzmann constant, T is the absolute temperature, and q the electron charge), and n is a multiplicative parameter calculated to obtain the desired compensation of the temperature variations of the voltage VBE. For a given collector current, the voltage VBE between the base and emitter of a bipolar transistor decreases as the temperature increases—in the jargon, the voltage VBE is a quantity of the CTAT (Complementary To Absolute Temperature) type—while the thermal voltage appears to be proportional to the temperature itself—in the jargon, the thermal voltage VT is a quantity of the PTAT (Proportional To Absolute Temperature) type.

According to an approach known in the state of the art, the bandgap voltage VBG may be generated by forcing a current Iptat provided by a current generator in a first reference circuit element comprising a transdiode coupled bipolar transistor, and mirroring the current Iptat in a second reference circuit element formed by a series of a resistor and a second transdiode coupled bipolar transistor having an emitter area different from that of the first bipolar transistor. Coupling the first reference circuit element and the second reference circuit element with respective input terminals of a high gain operational amplifier, and using the output of such operational amplifier to control the generator of the current Iptat, a negative feedback loop is established, which forces the first and second reference circuit elements voltages to a same value. With such a configuration, the current Iptat is found to be:

$$Iptat=[\ln(L1/L2)*(KT/q)]/Re,$$

where L1 and L2 are parameters proportional to the emitter areas, respectively, of the first bipolar transistor and of the second bipolar transistor, while Re is the resistance of the resistor comprised in the second reference circuit element; as may be seen from the equation, this current appears to be of the PTAT type, being proportional to the absolute temperature T. The current Iptat is then forced into a third reference circuit element comprising an element characterized by an electrical quantity of the CTAT type for generating the bandgap voltage VGB.

A major drawback that may afflict a configuration of this type is the extreme variability of the common-mode voltage of the operational amplifier input terminals. Indeed, this voltage being dependent from the base-emitter voltages VBE of the bipolar transistors included in the first and second reference circuit elements, it may vary in a range between 0.3 and 0.8 Volts depending on temperature and tolerances of the manufacturing process. Consequently, the operational amplifier is designed to handle the large input signal excursions without compromising the proper voltage reference circuit operation. However, this may be very difficult if the supply voltage has a reduced value, as happens in the circuits integrated using advanced CMOS (Complementary Metal Oxide Semiconductor) technologies. For example, in the 90 nm CMOS technology the power supply has a nominal value equal to 1.2 Volts; this value may actually decrease until reaching 0.9 Volts when the circuit has been designed to operate during stand-by phases in order to minimize losses due to the leakage currents presence. In these cases, the common-mode voltage excursions due to temperature change may be too large, and the transistors of the operational amplifier input stage may be forced to operate in the triode operation region, and thus the amplifier may not operate correctly.

In order to solve the above mentioned drawbacks, a solution provides for using an operational amplifier whose input stage consists of n-channel MOS transistors with reduced threshold voltage. However, although this allows the operational amplifier to operate correctly even in the presence of high excursions of the common-mode voltage, forming MOS transistors with reduced threshold voltage may require an additional lithography mask, and this may imply an increase in the whole circuit production costs.

According to a further solution, the common-mode voltage value is increased by introducing resistors in series with the first and second reference circuit elements and using the voltage drops that are generated as a result of the current Iptat flowing in these resistors. Nevertheless, the problem of the common-mode voltage excursion as a function of temperature may not be resolved; if the amplifier is be supplied with a low-supply voltage value, with this solution the common-mode voltage may, in fact, exceed the supply voltage itself, thus possibly compromising the proper functioning of the amplifier.

SUMMARY

An embodiment overcomes the above-mentioned drawbacks.

An embodiment relates to a bandgap voltage reference circuit to generate a bandgap reference voltage according to a first current. Said circuit comprises a current generator controlled by a first driving voltage for generating the first current based on the driving voltage. Said circuit further comprises a first reference circuit element adapted to generate a first reference voltage according to the first current and a second reference circuit element adapted to generate a second reference voltage according to the first current. The circuit further comprises an operational amplifier having a first input terminal coupled to the first circuit element for receiving a first reference input voltage according to the first reference voltage, a second input terminal coupled to the second reference circuit element for receiving a second input voltage according to the second reference voltage and an output terminal coupled to the controlled current generator to provide the first driving voltage. The circuit further comprises a control circuit. Said control circuit comprises first capacitive means having a first terminal coupled to the first reference circuit element to receive the first reference voltage and a second terminal coupled to the first input terminal to provide the first input voltage. The control circuit also comprises second capacitive means comprising a first terminal coupled to the second reference circuit element for receiving the second reference voltage and a second terminal coupled to the second input terminal to provide the second input voltage. The control circuit further comprises first biasing means for selectively providing a first common mode voltage to the second terminals of the first and second capacitive means. The operational amplifier is an offset compensated operational amplifier further comprising a first compensation terminal for receiving the first common-mode voltage and a second compensation terminal coupled to an offset management circuit for receiving a first compensation voltage. The offset management circuit comprises an auxiliary operational amplifier having a first input terminal adapted to receive a third input voltage corresponding to the first input voltage, a second input terminal adapted to receive a fourth input voltage corresponding to the second input voltage, and an output terminal adapted to be selectively coupled to the second compensation terminal of the operational amplifier for providing the first compensation voltage.

An embodiment relates to a method for operating a bandgap voltage reference circuit.

BRIEF DESCRIPTION OF THE DRAWINGS

One or more embodiments, as well as features and advantages thereof, will be better understood by reference to the following detailed description, given purely by way of a non-restrictive indication, to be read in conjunction with the attached figures. In particular.

DETAILED DESCRIPTION

Figure 1A:
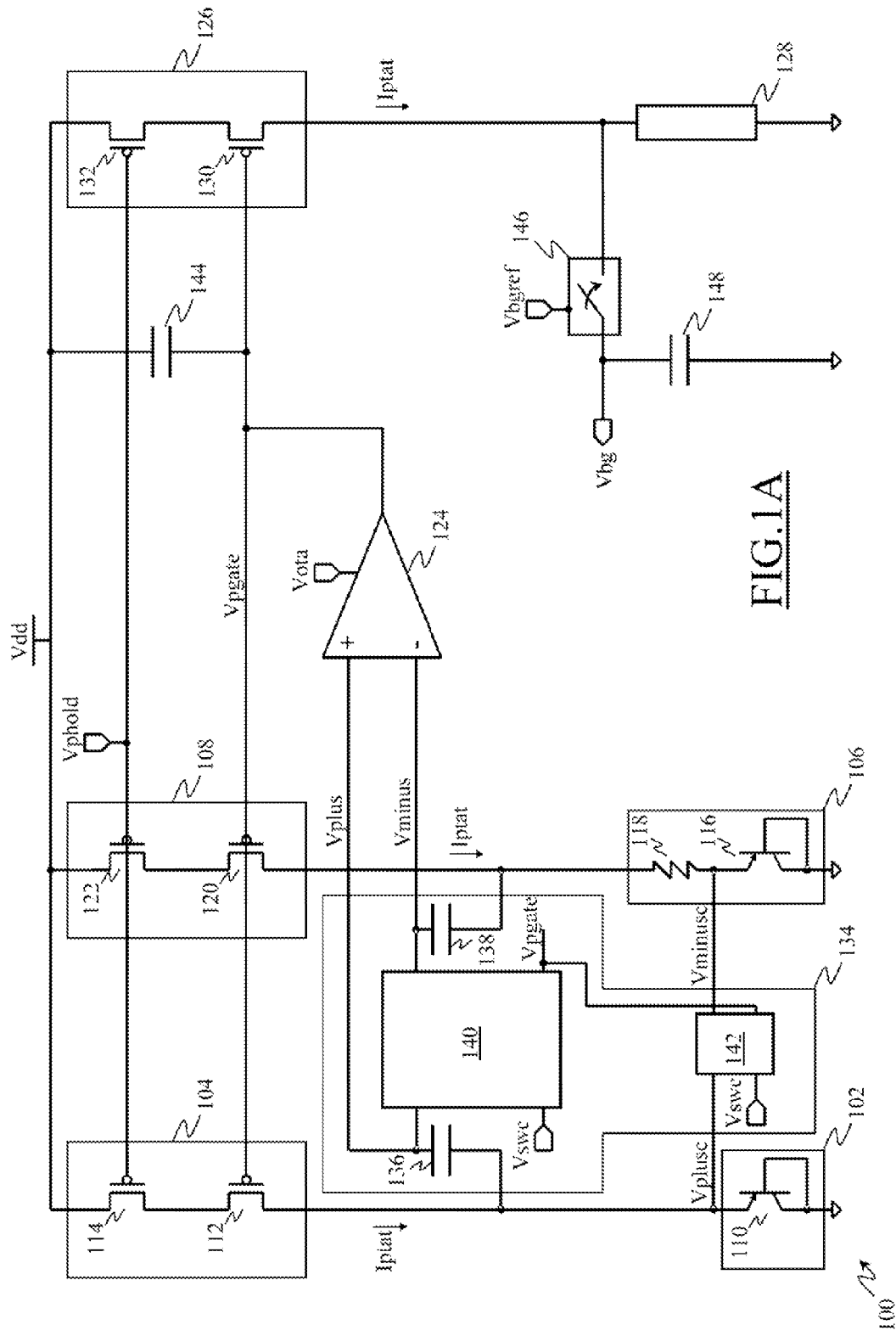
FIG. 1A shows a bandgap voltage reference circuit according to an embodiment.

With reference to FIG. 1, a bandgap voltage reference circuit 100 is shown according to an embodiment.

The circuit 100 comprises a first reference circuit element 102 coupled to a first current generator 104 adapted to generate a current identified in the figure with the reference Iptat. The circuit 100 also comprises a second reference circuit element 106 coupled to a second current generator 108; the current generator 108 is coupled with the current generator 104 in a mirror configuration.

The reference circuit element 102 comprises a bipolar PNP type transistor 110 having a collector terminal coupled to a terminal that provides a ground voltage, a base terminal coupled to the collector terminal, and an emitter terminal coupled to a terminal of the current generator 104, which provides the current Iptat.

The current generator 104 comprises a first p-channel MOS transistor 112 having a drain terminal coupled to the transistor 110 emitter terminal for providing the current Iptat, a gate terminal coupled to current generator 108, and a source terminal coupled to a drain terminal of a second p-channel MOS transistor 114. The transistor 114 has a gate terminal coupled to the current generator 108 and a source terminal coupled to a terminal that provides a supply voltage Vdd. The gate terminal of the transistor 114 is also adapted to receive a hold signal Vphold used to selectively activate/deactivate the current Iptat supply. In particular, when the hold signal Vphold is at a low value, such as the ground voltage, the transistor 114 turns out to be turned on, while when the hold signal Vphold is at a high value, such as the supply voltage Vdd, the transistor 114 turns out to be turned off; in the latter case, the supplying of the current Iptat is be interrupted.

The reference circuit element 106 comprises a bipolar PNP type transistor 116 having a collector terminal coupled to a terminal providing the ground voltage, a base terminal coupled to the collector terminal, and an emitter terminal coupled to a first terminal of a resistor 118. The resistor 118 comprises a second terminal coupled to a terminal of the current generator 108 that provides a mirrored version of the current Iptat.

The current generator 108 comprises a first p-channel MOS transistor 120 having a drain terminal coupled to the resistor 118 to provide the current Iptat, a gate terminal coupled to the gate terminal of the transistor 112 and a source terminal coupled to the drain terminal of a second p-channel MOS transistor 122. The transistor 122 has a gate terminal coupled to the gate terminal of the transistor 114 and a source terminal coupled to a terminal providing the supply voltage Vdd.

The circuit 100 also comprises an operational amplifier 124 comprising a non-inverting input terminal ("+") coupled to the transistor 110 emitter terminal, an inverting input terminal ("−") coupled to the second terminal of the resistor 118 and an output terminal coupled to the current generators 104, 108 for providing a driving voltage Vpgate to the gate terminals of the transistors 112 and 120 in order to adjust the value of the current Iptat. According to an embodiment, the operational amplifier 124 has a differential input stage comprising an input pair formed by n-channel MOS transistors, each biased by a bias current corresponding to the current Iptat. The operational amplifier 124 may also be turned on (and off) in a selective manner depending on the value assumed by a control signal Vota provided to a control terminal of the amplifier. In an embodiment, the operational amplifier 124 has a high gain and a high output impedance.

Figure 1B:
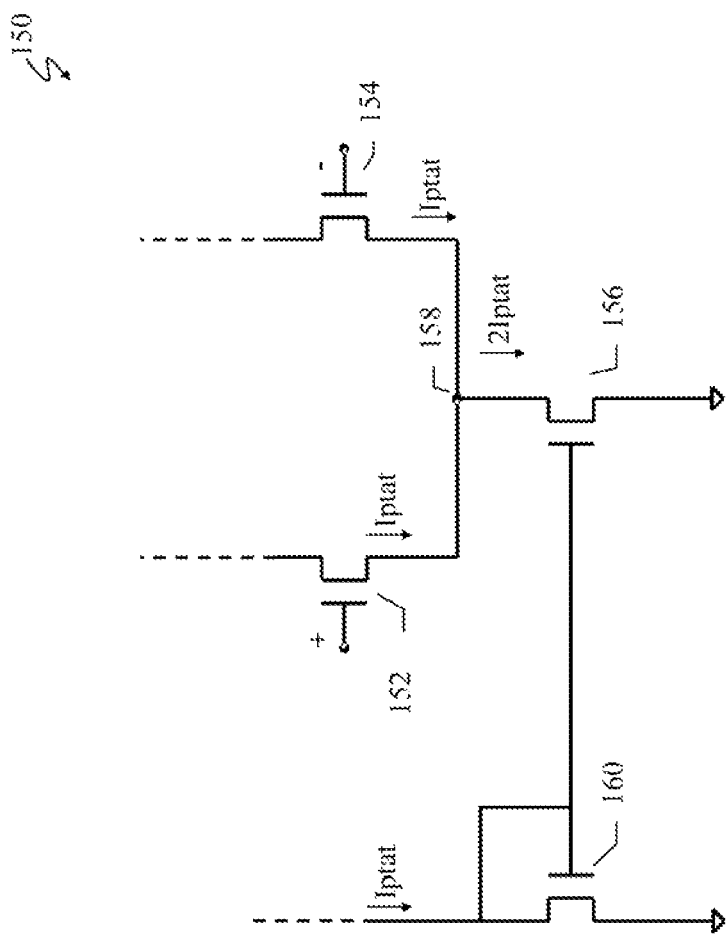
FIG. 1B shows a portion of an input stage of an embodiment of an operational amplifier in the circuit of FIG. 1A.

FIG. 1B shows the circuit structure of an input stage portion—identified in the figure with the reference 150—of the operational amplifier 124 according to an embodiment.

The input stage 150 comprises a pair of n-channel MOS transistors 152, 154 coupled in differential configuration. In particular, the transistor 152 has a drain terminal coupled to a load (not shown in the figure), a gate terminal that represents the non-inverting terminal of the operational amplifier 124, and a source terminal coupled to a drain terminal of an n-channel MOS transistor 156 (circuit node 158) adapted to provide the bias current of the transistors 152 and 154. The transistor 154 has a drain terminal coupled to a load (not shown in the figure), a gate terminal which is the inverting terminal of the operational amplifier 124, and a source terminal coupled to the node 158.

The transistor 156 comprises a source terminal coupled to a terminal that provides the ground voltage and a gate terminal coupled to a gate terminal of a further n-channel MOS transistor 160. The transistor 160 has a source terminal coupled to a terminal that provides the ground voltage and a drain terminal coupled to the gate terminal. The transistor 160 is configured to conduct a current equal to the current Iptat; such current may, for example, be supplied to the transistor 160 from one of the current generators 104 and 108 of the circuit 100.

According to an embodiment, the transistors 152, 154 and 160 have the same form factor FF=W/L—where W is the gate region width and L is the gate region length—, while the transistor 156 has a form factor FF' equal to 2*W/L. In this way, the drain current of the transistor 156 turns out to be twice the drain current of the transistor 160, i.e. 2*Iptat. Given the structure symmetry, if the pair of transistors 152, 154 does not appear to be overly unbalanced (e.g. if the amplifier operates in the so-called amplification region) each transistor of the pair 152, 154 is conducting a current value approximately equal to Iptat during steady-state operation.

Still referring to FIG. 1A, the presence of the operational amplifier 124 having the inputs coupled to the reference circuit elements 102, 106 and the output coupled to the current generators 114 and 118 forms a negative feedback loop, through which the voltages of the first and second circuit elements 102, 106 are brought to approximately a same value, and the generated current Iptat appears to be proportional to the absolute temperature, i.e. it turns out to be a quantity of the PTAT type.

The current Iptat thus generated is then mirrored by a third current generator 126 and forced into a third reference circuit element 128 for generating a bandgap voltage Vbg, which represents the circuit 100 output. Without going into details already known, the reference circuit element 128 may be formed by a resistive divider comprising an element characterized by an electrical quantity of the CTAT type—such as the voltage between the base and emitter of a transdiode coupled bipolar transistor—which compensates for the PTAT behavior of the current Iptat.

The current generator 126 comprises, in particular, a first p-channel MOS transistor 130 having a drain terminal coupled to the reference circuit element 128 for providing the current Iptat, a gate terminal coupled to the gate terminal of the transistor 112, and a source terminal coupled to the drain terminal of a second p-channel MOS transistor 132. The transistor 132 has a gate terminal coupled to the gate terminal of the transistor 114 and a source terminal coupled to a terminal providing the supply voltage Vdd.

According to an embodiment, the value of the common-mode voltage to the inputs of the operational amplifier 124 is adjusted by a common mode management circuit block—identified in the figure with the reference 134—so that the transistors of the operational amplifier 124 input stage operate in saturation. As will become clearer later in this description, the circuit block 134 is configured to receive the reference voltages of the reference circuit elements 102, 106, and appropriately shift them using capacitors in series with the operational amplifier 124 inputs. In particular, a first capacitor 136 has a first terminal coupled to the emitter terminal of the transistor 110 for receiving a voltage Vplusc and a second terminal coupled to the non-inverting input terminal of the operational amplifier 124 to provide a voltage Vplus; a second capacitor 138 has instead a first terminal coupled to the second terminal of the resistor 118 and a second terminal coupled to the inverting input terminal of the operational amplifier 124 to provide a voltage Vminus.

The circuit block 134 includes of two main sub-blocks, i.e. a biasing block 140 and a short-circuit block 142.

The biasing block has a first terminal for receiving a digital control signal Vswc, a second terminal for receiving the driving voltage Vpgate, a third terminal coupled to capacitor 136 second terminal, and a fourth terminal coupled to the capacitor 138 second terminal. As will be described below, the biasing block 140 is adapted to generate the common-mode voltage that is actually supplied to the operational amplifier 124 inputs; said voltage is selectively forced to the operational amplifier 124 inputs according to the control signal Vswc short-circuiting the second terminals of the capacitors 136 and 138 coupled to the operational amplifier 124 inputs. In this way the voltages Vplus and Vminus are brought to the voltage value determined by the biasing block 140.

The short-circuit block 142 has a first terminal for receiving the control signal Vswc, a second terminal for receiving the driving voltage Vpgate, a third terminal coupled to the emitter terminal of the transistor 110 for receiving the voltage Vplusc, and a fourth terminal coupled to the emitter terminal of the transistor 116 for receiving a voltage Vminusc. Alternatively, the fourth terminal may be coupled to the node between the resistor 118 and the capacitor 138. The short-circuit block 142 is capable of selectively short-circuiting the emitter terminal of the transistor 110 with the emitter terminal of the transistor 116 (or to the opposite node of the resistor 118) according to the control signal Vswc.

In addition, in order to allow the voltages across the capacitors 136 and 138 to be updated with the values generated by the biasing block 140, and at the same time ensure a proper operation of the system, in an embodiment the circuit 100 has a "sample and hold" type architecture, whose operation comprises an alternating sequence of holding phases (hold signal Vphold high) and regeneration phases (hold signal Vphold low). In particular, the circuit 100 is provided with a first retention capacitor 144 coupled between a terminal that provides the supply voltage Vdd and the operational amplifier 124 output terminal for storing the driving voltage Vpgate when the operational amplifier 124 is turned off, and a circuit for sampling and holding the bandgap voltage Vbg. The circuit for sampling and holding the bandgap voltage Vbg comprises a controlled switch 146 having a first conduction terminal coupled to the drain terminal of the transistor 130, a second conduction terminal to provide the bandgap voltage Vbg and a control terminal to receive a sampling signal Vbgref; the circuit for sampling and holding the bandgap voltage Vbg also comprises a second retention capacitor 148 having a first terminal coupled to the second conduction terminal of the controlled switch 146 and a second terminal coupled to a terminal which receives the ground voltage. When the sampling signal is asserted, for example at the supply voltage Vdd, the controlled switch is closed, and the bandgap voltage Vbg is determined by the voltage drop generated across the reference circuit element 128 crossed by the current Iptat. When the sampling signal is deasserted, for example at the ground voltage, the controlled switch is open, and the bandgap voltage Vbg is determined by the voltage drop across the capacitor 148.

Figure 2:
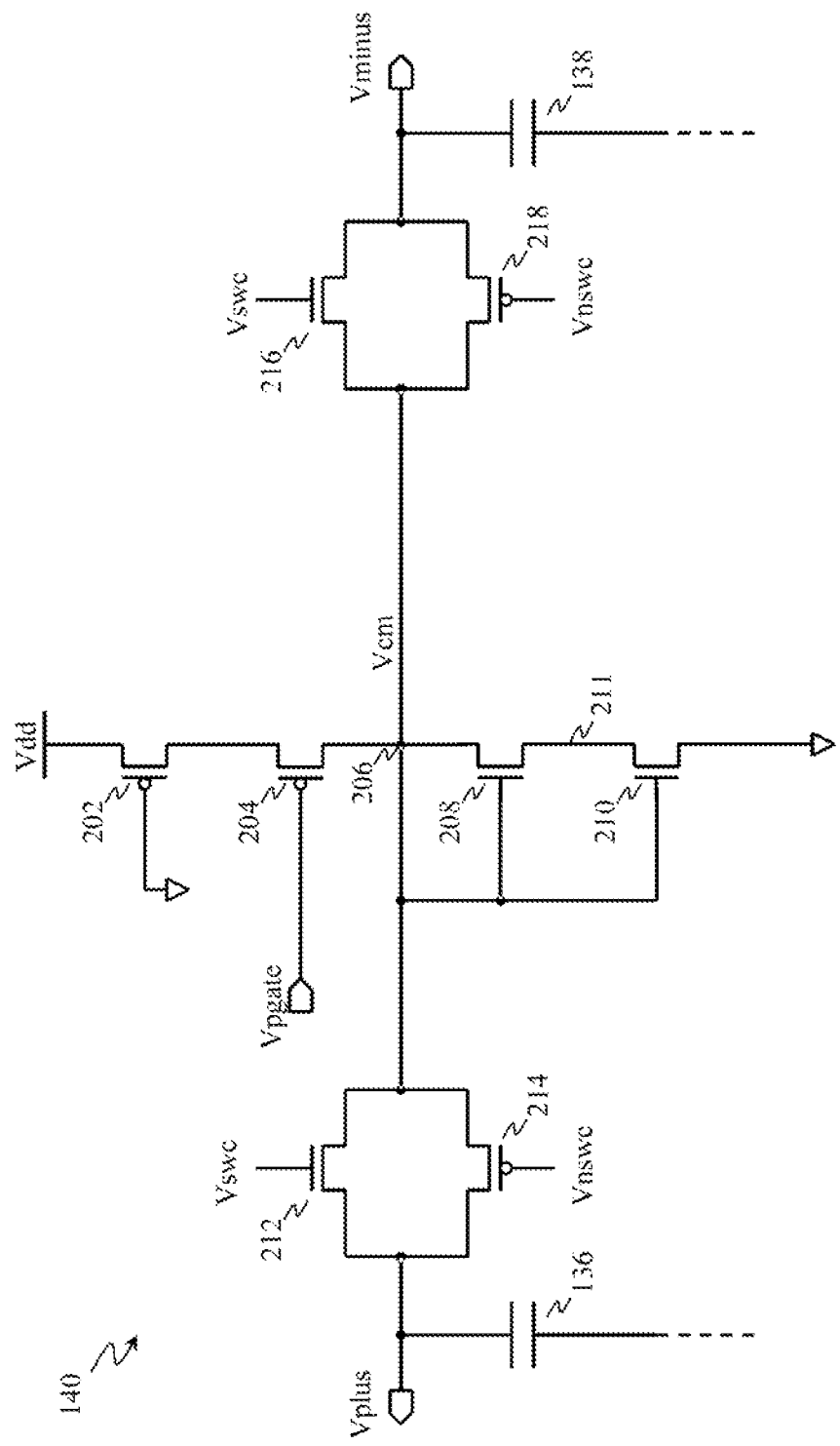
FIG. 2 shows the circuit structure of a biasing block the circuit of FIG. 1A according to an embodiment.

The biasing block 140 circuit structure according to an embodiment is illustrated in FIG. 2.

The block 140 includes a bias current generator comprising two p-channel MOS transistors 202, 204. The transistor 202 has a source terminal coupled to a terminal providing the supply voltage Vdd, a gate terminal coupled to a terminal that provides the ground voltage and a drain terminal coupled to a source terminal of the transistor 204. The transistor 204 has a gate terminal that receives the driving voltage Vpgate, and the drain terminal coupled to a circuit node identified in the figure with the reference 206. The transistors 202, 204 are sized in a similar manner (e.g., equal) to the transistors 112, 114 of the current generator 104. Consequently, since the gate terminal of the transistor 204 is driven by the same driving signal Vpgate provided to the gate terminal of the transistor 112, the current generated by the transistor 204 matches (for example, is approximately equal) to the current Iptat.

The biasing block 140 also includes a common mode generator comprising two n-channel MOS transistors 208, 210 adapted to bias the node 206 with a common-mode voltage Vcm. The transistor 208 has a drain terminal and a gate terminal coupled to the node 206, and a source terminal coupled to a drain terminal of the transistor 210 (circuit node 211). The transistor 210 has a gate terminal coupled to the circuit node 206, and a source terminal coupled to a terminal that provides the ground voltage.

The biasing block 140 further comprises a first transmission gate adapted to selectively connect the node 206 with the second terminal of the capacitor 136 according to the value assumed by the control signal Vswc, and a second transmission gate adapted to selectively connect the node 206 with the second terminal of the capacitor 138 as a function of control signal Vswc. In particular, the first transmission gate comprises a n-channel MOS transistor 212 having a first conduction terminal coupled to the node 206, a gate terminal driven by the control signal Vswc and a second conduction terminal coupled to the second terminal of the capacitor 136 and a p-channel MOS transistor 214 having a first conduction terminal coupled to the node 206, a gate terminal driven by a negated version of the control signal Vswc, identified in the figure with the reference Vnswc, and a second conduction terminal coupled the second terminal of the capacitor 136; the second transmission gate comprises an n-channel MOS transistor 216 having a first conduction terminal coupled to the node 206, a gate terminal driven by the control signal Vswc and a second conduction terminal coupled to the second terminal of the capacitor 138, and a p-channel MOS transistor 218 having a first conduction terminal coupled to the node 206, a gate terminal driven by the signal Vnswc, and a second conduction terminal coupled to the second terminal of the capacitor 138.

In this way, when the control signal Vscw is asserted (e.g. to the value of the supply voltage Vdd), both the transmission gates are closed, and the voltages Vplus and Vminus provided to operational amplifier 124 inputs assume the common-mode voltage Vcm value generated by the transistors 208 and 210. According to an embodiment, the transistors 208 and 210 are sized so that the common-mode voltage Vcm generated by them has a value such that the transistors 152, 154 and 156 of the input stage 150 of the operational amplifier 124 operate in the saturation zone.

In particular, in an embodiment, the transistor 208 has a form factor FF that is equal to the form factor FF of the transistors 152, 154 and 160 of the input stage 150, while the transistor 210 has a form factor FF"=W/(X*L), where X is a scale factor greater than or equal to three. In other words, according to an embodiment, a potentially optimal value of the common-mode voltage Vcm may be obtained by making the transistor 210 more resistive than the transistors 152, 154 and 160 of the input stage 150 of the operational amplifier 124.

In order to understand why a more resistive transistor 210 may be capable of generating a potentially optimal common-mode voltage Vcm such that the transistors of the input stage 150 of the operational amplifier 124 work in the saturation zone, reference will be now made jointly to FIGS. 1B and 2.

During circuit operation, the transistor 208 of the biasing block 140 operates in the saturation zone, while the transistor 210 operates in the triode zone. Consequently, the current Iptat across these transistors is equal to:

$$Iptat=(\beta/X)*(Vcm-Vth-\tfrac{1}{2}*Vx)*Vx \text{ (current of the transistor 210)};$$

$$Iptat=(\beta)*(Vcm-Vx-Vth)^2 \text{ (current of the transistor 208)},$$

where $\beta$ is the transistor 208 gain, X is the transistor 210 scaling factor, Vth is the threshold voltage of the transistors 208 and 210, and Vx is the voltage at the node 211 of the biasing block 140. Equating the above equations yields the following relationship:

$$Vx=(\sqrt{(1+X)}-1)*\sqrt{(2*Iptat/\beta)}, \qquad (1)$$

where $\sqrt{\ (\ )}$ is the square root operation.

In order to operate the transistor 156 of the input stage 150 of the operational amplifier 124 in the saturation zone, the following condition is fulfilled:

$$Vc>\sqrt{(2*Iptat/\beta)}, \qquad (2)$$

where Vc is the voltage at the node 158 of the input stage 150.

Since, in the amplification operating region, the transistors 152 and 154 of the input stage 150 of the operational amplifier 124 conduct a current approximately equal to Iptat, applying the common-mode voltage Vcm generated by the biasing block 140 to the gate terminals of the transistors 152 and 154, the voltage Vc at node 158 of the input stage 150 assumes a value approximately equal to the voltage Vx at the node 211 of the biasing block 140. In other words, the condition for which the transistor 156 of the input stage 150 works in the saturation zone becomes:

$$Vx>\sqrt{(2*Iptat/\beta)}. \qquad (3)$$

According to the relation (1), the condition (3) becomes:

$$(\sqrt{(1+X)}-1)*\sqrt{(2*I\text{ptat}/\beta)} > \sqrt{(2*I\text{ptat}/(\beta))}, \quad (4)$$

i.e.:

$$(\sqrt{(1+X)}-1) > 1. \quad (5)$$

Solving with respect to X, the condition (5) becomes:

$$X > 3, \quad (6)$$

i.e. the condition for having a potentially optimum value for the common-mode voltage Vcm to be provided to the operational amplifier 124 involves providing the transistor 210 a form factor FF"=W/(X*L) equal to one third (or less) of the form factor FF of the transistors 152, 154 of the operational amplifier 124.

Figure 3:
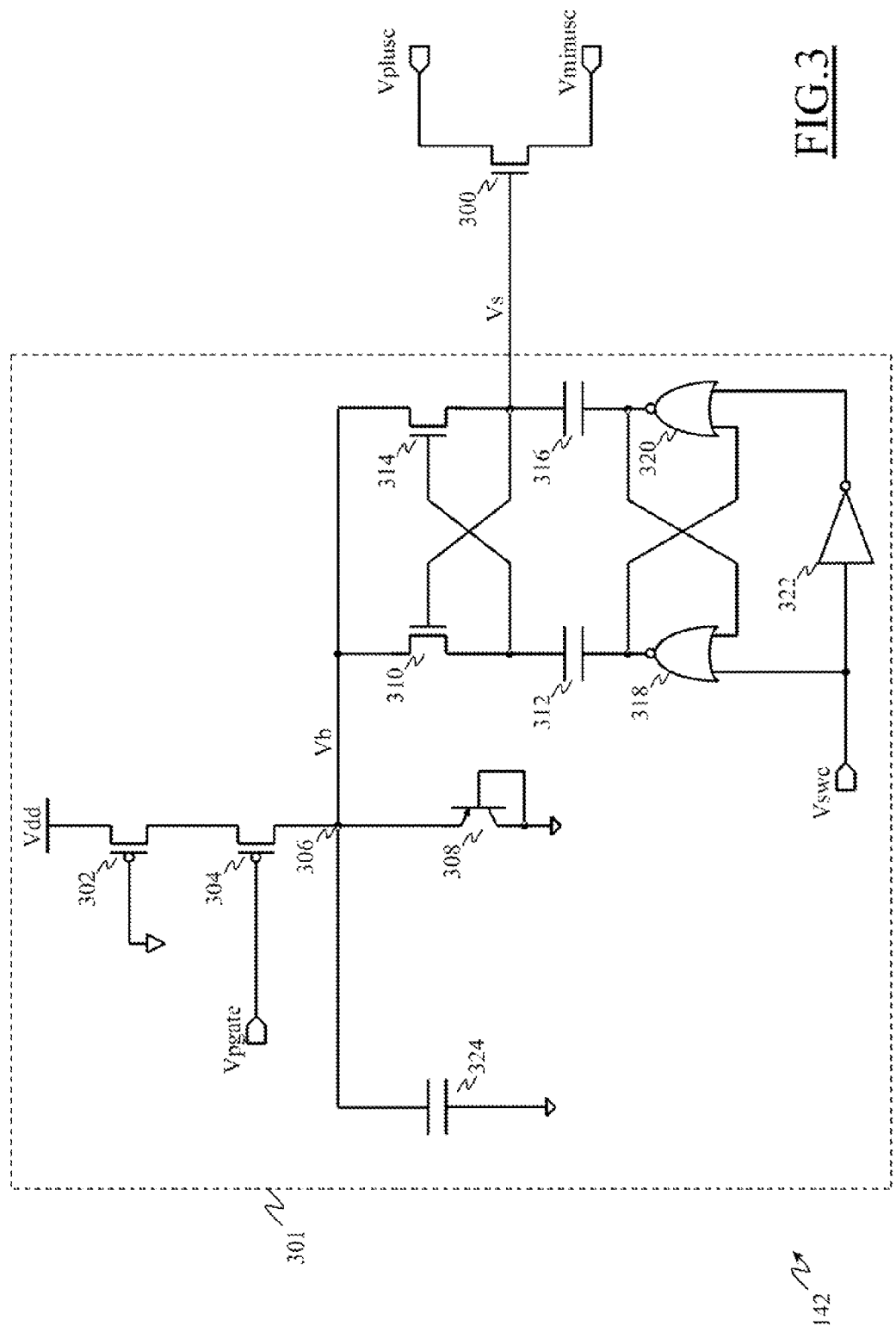
FIG. 3 illustrates the circuit structure of a short-circuit block in the circuit of FIG. 1A according to an embodiment.

The circuit structure of the short-circuit block 142 according to an embodiment is illustrated in FIG. 3.

The short-circuit block 142 comprises two sections, namely a controlled switch 300 adapted to selectively short-circuit the emitter terminals of the transistors 110 and 116 comprised in the reference circuit elements 102 and 106 (or short-circuit the emitter of the transistor 110 to the bottom node of the capacitor 138), and a driver circuit 301 capable of driving the controlled switch 300 according to the control signal Vswc.

The controlled switch 300 is formed by an n-channel MOS transistor, having a first conduction terminal coupled to the emitter terminal of the transistor 110 to receive the voltage Vplusc, a second conduction terminal coupled to the emitter terminal of the transistor 116 (or to the bottom node of the capacitor 138) to receive the voltage Vminusc, and a gate terminal coupled to the driver circuit 301 for receiving a driving voltage Vs. Given that in modern integrated circuits the supply voltage Vdd typically has a very small value, in order to correctly drive the controlled switch 300, it may be necessary that the driving voltage Vs is able to assume values greater than the supply voltage Vdd one. On the other hand, in order to prevent the occurrence of circuit malfunctions, the maximum value the driving voltage Vs may assume is lower than the oxide breakdown voltage of the controlled switch 300.

For this reason, according to an embodiment, the driving circuit 301 that generates the driving voltage Vs is a so-called "boost" circuit, and in particular is a circuit of the "clock booster" type. In detail, the driving circuit 301 comprises a current generator comprising two p-channel MOS transistors 302, 304. The transistor 302 has a source terminal coupled to a terminal providing the supply voltage Vdd, a gate terminal coupled to a terminal that provides the ground voltage, and a drain terminal coupled to a source terminal of the transistor 304. The transistor 304 has a gate terminal that receives the driving voltage Vpgate, and the drain terminal coupled to a circuit node identified in the figure with the reference 306. The transistors 302, 304 are sized in a similar manner (e.g., equal) to the transistors 112, 114 of the current generator 104. Consequently, since the gate terminal of the transistor 304 is driven by the same driving signal Vpgate provided to the gate terminal of the transistor 112, the current generated by transistor 304 corresponds (for example, appears to be equal) to the current Iptat.

The driving circuit 301 also comprises a bipolar p-channel transistor 308 having an emitter terminal coupled to the node 306, a collector terminal coupled to a terminal that provides the ground voltage, and a base terminal coupled to the collector terminal. The transistor 308 is sized in a similar way (i.e., approximately equal) to the transistor 110 included in the reference circuit element 102, so that the voltage of node 306, identified in the figure with the reference Vb, is as close as possible to the value of the voltages Vplusc, Vminusc of the emitter terminals of the transistors 110 and 116.

The node 306 is also coupled to a drain terminal of a n-channel MOS transistor 310, which transistor has a source terminal coupled to a first terminal of a capacitor 312 and a gate terminal coupled to a source terminal of a further n-channel MOS transistor 314. The transistor 314 further comprises a drain terminal coupled to the node 306 and a gate terminal coupled to the source terminal of the transistor 310; the source terminal of the transistor 314 is also coupled to a first terminal of a capacitor 316 and to the gate terminal of the controlled switch 300 to provide the driving voltage Vs.

The capacitor 312 also comprises a second terminal coupled to an output terminal of a first two-input NOR logic gate, identified in the figure with the reference 318. The capacitor 316 comprises a second terminal coupled to an output terminal of a second two-input NOR logic gate, identified in the figure with the reference 320. The NOR gate 318 comprises a first input terminal capable of receiving the control signal Vswc and a second input terminal coupled to the output terminal of the NOR gate 320; the NOR gate 320 comprises a first input terminal coupled to the output terminal of the NOR gate 318 and a second input terminal coupled to an output terminal of a NOT logic gate 322. The NOT gate 322 comprises an input terminal capable of receiving the control signal Vswc.

When the control signal Vswc is deasserted to the ground voltage, the output of the NOR gate 318 is brought to the supply voltage Vdd, while the output of the NOR gate 320 is brought to the ground voltage. In this situation, the gate terminal of the transistor 314 is brought to a voltage value approximately equal to Vb+Vdd; consequently, the transistor 314 is turned on while the transistor 310 is off, and the driving voltage Vs has a value equal to the voltage Vb. Since the driving circuit 301 is sized such that the voltage Vb has a value similar to that of the voltages Vplusc, Vminusc, in this condition the controlled switch 300 is open.

When the control signal Vswc is instead asserted to the supply voltage, the output of the NOR gate 320 is brought to the power supply voltage Vdd, while the output of the NOR gate 318 is brought to the ground voltage. Consequently, the gate terminal of the transistor 314 is brought to a voltage of about Vb; therefore, the transistor 314 is turned off while the transistor 310 is turned on, and the driving voltage Vs is brought to a value equal to Vb+Vdd. In this condition, the controlled switch 300 is closed.

The driving circuit 301 also comprises a capacitor 324 coupled between the node 306 and a terminal that provides the ground voltage. The function of this capacitor is to provide the electrical charge needed to compensate for the inevitable changes in the voltage Vb of the node 306 that occur due to the switching of the NOR gates 318 and 320.

Figure 4:
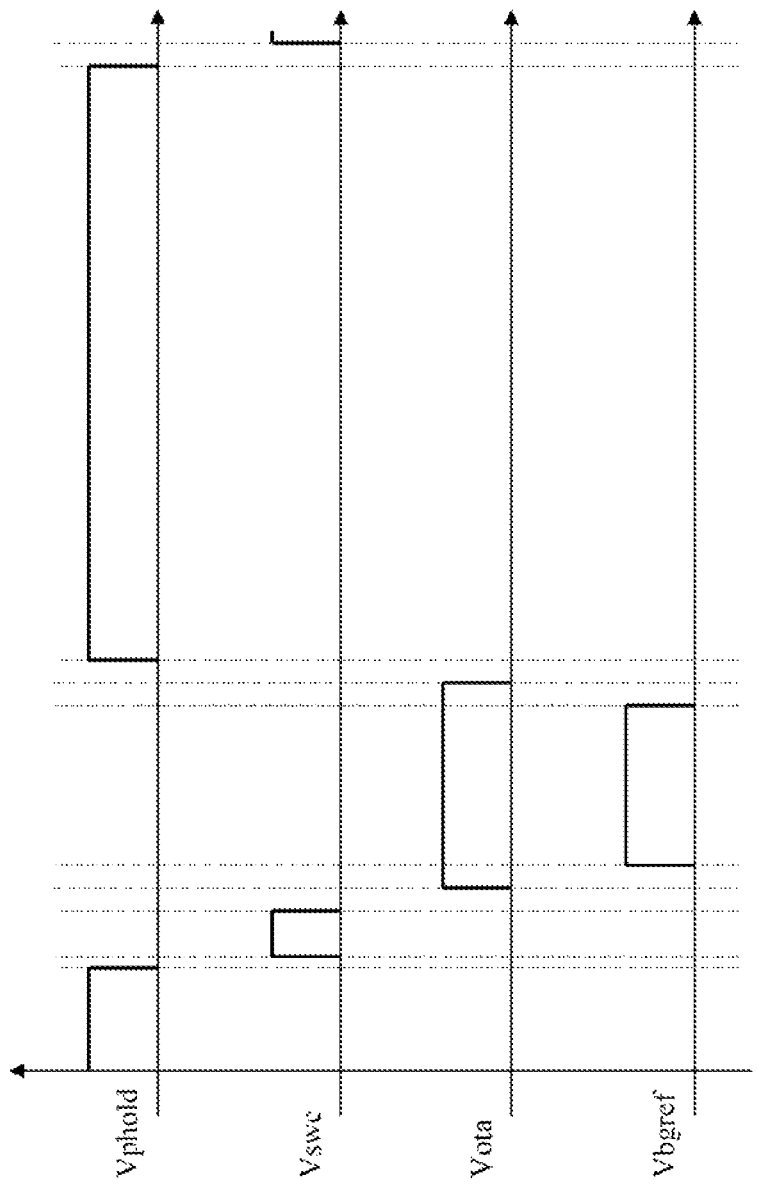
FIG. 4 is a timing diagram that shows the evolution over time of some of the signals generated by and received from an embodiment of the circuit of FIG. 1A.

The overall operation of circuit 100 will be now described, referring to the figures previously described in conjunction with the FIG. 4; FIG. 4 is a timing diagram illustrating the trend in time of some of the signals generated/received by the circuit 100.

As described above, the circuit 100 according to an embodiment, has a "sample and hold" architecture, whose operation comprises a sequence of alternating holding phases and regeneration phases scanned by the value assumed by the hold signal—in particular, during the holding phases the hold signal Vphold is at a high voltage level, while during the regeneration phases that signal is at a low voltage level.

Consequently, at the beginning of each regeneration phase, the hold signal Vphold is brought to a low voltage level (ground voltage). In this situation, the transistors 114, 122 and 132 are turned on, and the current generators 104, 108, 126 are enabled to generate the current Iptat in various branches of the circuit.

Subsequently, the control signal Vota as well is brought to a low voltage level (ground voltage) in order to disable the operational amplifier 124, and bring the output thereof in a high impedance state. It is stressed that in this phase the driving voltage Vpgate is equal to the value corresponding to the charge that was stored in the capacitor 144 during the previous holding phase, set in turn by a previous activation of the operational amplifier 124.

The control signal Vswc is then brought to a high voltage level (Vdd) to turn on the biasing block 140 and the short-circuit block 142. In particular, the transmission gates of the biasing block 140 are closed, shorting the second terminal of the capacitor 136 with the second terminal of the capacitor 138; simultaneously, the controlled switch 300 of the short-circuit block 142 is closed, too, in order to short circuit the emitter terminal of the transistor 110 (coupled to the first terminal of the capacitor 136) with the emitter terminal of the transistor 116 (coupled to the first terminal of the capacitor 138 through the resistor 118 or directly with the first terminal of the capacitor 138). In this situation, the voltage Vplus at the non-inverting terminal of the operational amplifier 124 and the voltage Vminus at the inverting terminal of the operational amplifier 124 are brought to the common-mode voltage Vcm generated by the transistors 208 and 210 of the biasing block 140, while a voltage drop dVc equal to:

$$dVc=(Vcm-Veb),$$

is set on the capacitors 136 and 138, where Veb=Vplusc=Vminusc (particularly where the terminal Vminusc of the short-circuit block 142 is coupled directly to the first node of the capacitor 138).

Therefore, according to an embodiment, the common-mode voltage at the operational amplifier 124 inputs is set to the value Veb generated by the reference circuit elements 102, 106 plus a shift value dVc generated by electronic devices that are subject to conditions (such as biasing and temperature) very similar to those the components of the operational amplifier 124 are subjected to, and that also were manufactured during the same manufacturing process. In other words, according to an embodiment, the common-mode voltage at the operational amplifier 124 inputs is set to an approximately optimal value, which follows the variations in temperature and the polarization the circuit 100 is subject to, and which appears to be calibrated according to the specific parameters of the process by means of which the circuit 100 was manufactured.

At this point the control signal Vswc is brought to a low voltage level (ground voltage), so that the transmission gates of the biasing block 140 and the controlled switch 300 of the short-circuit block 142 are opened.

Subsequently, the control signal Vota is brought to a high voltage level (Vdd), so as to enable the operational amplifier 124, and allow formation of the negative feedback loop between the voltage across the reference circuit elements 102, 106 and the driving voltage Vpgate of the current generators 104, 108 and 106. In particular, the driving voltage Vpgate across the capacitor 144 is regenerated by the operational amplifier 124 based on values assumed by the voltages Vplus and Vminus.

The sampling signal Vbgref is thus brought to a high voltage level (Vdd) to close the controlled switch 146 in order to regenerate the bandgap voltage Vbg across the capacitor 148.

Thereafter, both the sampling signal Vbgref and the control signal Vota are brought to a low voltage level (ground voltage) in order to open the controlled switch 146 and disable the operational amplifier 124. The voltages Vbg and Vpgate are then stored by the capacitors 148 and 144.

At this point the hold signal Vphold is brought to a high voltage level (Vdd), and the holding phase starts. During the holding phase, the power consumption is minimized due to the fact that the transistors 114, 122 and 132 are disabled, so the generation of the current Iptat by the current generators 104, 108, 126 is inhibited. The values of the voltages Vpgate and Vbg used by the circuit 100 during the whole holding phase correspond to those stored in the capacitors 148 and 144.

The bandgap voltage Vbg generated by the circuit 100 up to now described may, however, assume a different value from the desired one, caused by a possible offset voltage present between the inverting terminal and the non-inverting terminal of the operational amplifier 124. In particular, considering the presence of this offset voltage, the voltages Vplusc and Vminusc set using the negative feedback loop defined by the operational amplifier 124 may not be equal, thereby altering the value of the current Iptat used for the generation of the bandgap voltage Vbg.

Figure 5:
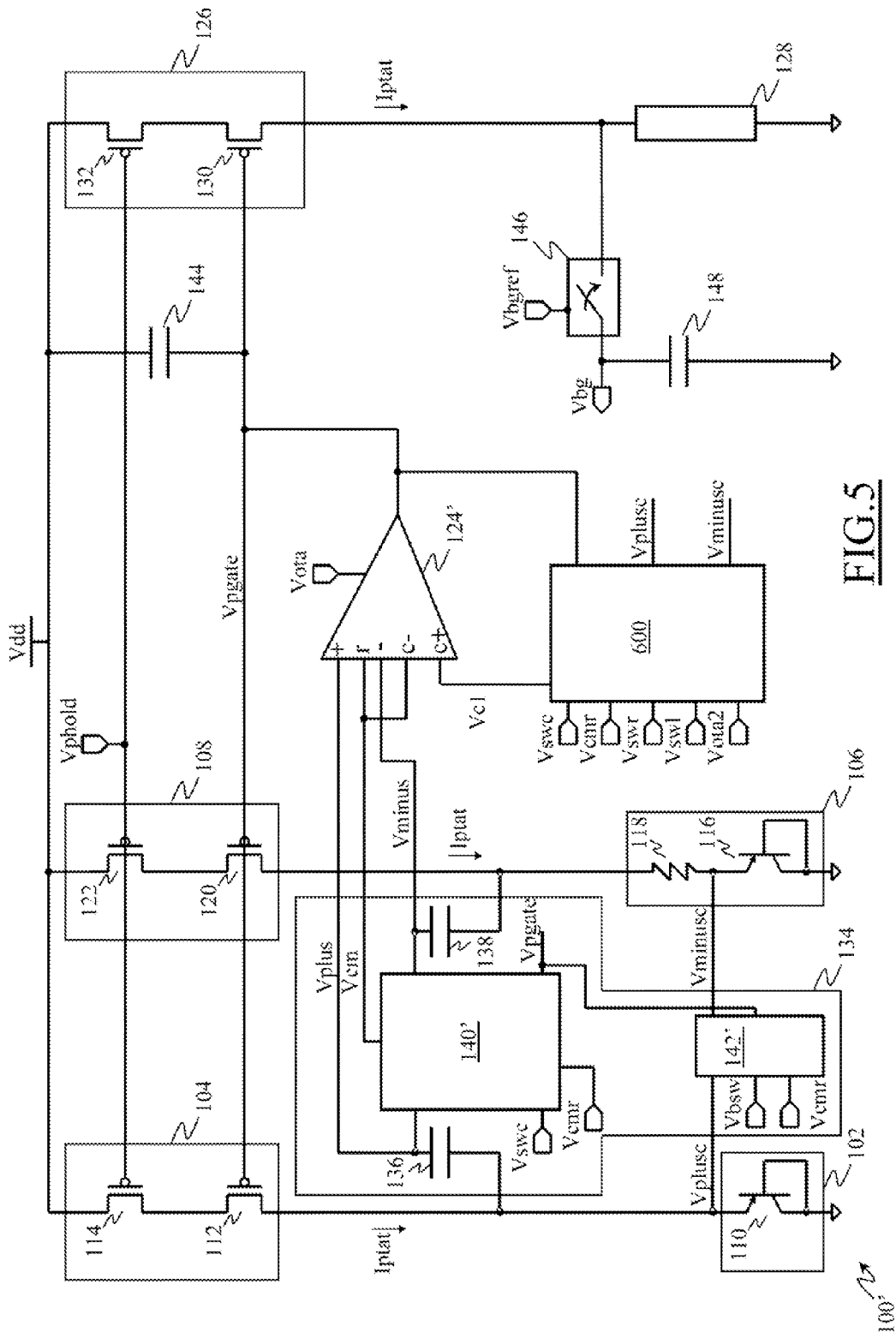
FIG. 5 shows a bandgap voltage reference circuit according to a further embodiment.

In accordance with an embodiment, in order to eliminate (or at least minimize as far as possible) the negative effect due to the offset voltage between the inputs of the operational amplifier 124, the circuit 100 may be opportunely modified as shown in FIG. 5. This modified version of the circuit 100 is identified in FIG. 5 with the reference 100'.

An embodiment of the bandgap voltage reference circuit 100' differs from the circuit 100 since the operational amplifier 124 is replaced with an offset compensated operational amplifier 124', and said operational amplifier 124' is coupled to an offset management circuit—identified in the figure with the reference 600—whose function is to estimate the offset voltage of the amplifier 124' and to compensate the offset voltage, and thus drive the amplifier in a potentially improved manner. In the same way as for the operational amplifier 124, the operational amplifier 124' has a non-inverting input terminal ("+") coupled to the second terminal of the capacitor 136 to receive the voltage Vplus, an inverting input terminal ("−") coupled to the second terminal of the capacitor 138 to receive the voltage Vminus, and an output terminal coupled to the current generators 104, 108 to provide the driving voltage Vpgate to the gate terminals of the transistors 112 and 120 in order to adjust the value of the current Iptat; the operational amplifier 124' is also provided with a reference terminal to receive the common-mode voltage Vcm from the common-mode management circuit block 134, and a pair of terminals for the compensation of the offset, comprising a non-inverting compensation terminal ("c+") coupled to the offset management circuit 600 for receiving a compensation voltage Vc1, and an inverting compensation terminal ("c−") for receiving the common-mode voltage Vcm from the common-mode management circuit block 134. As will become clearer in the following, the compensation voltage Vc1 generated by the offset management circuit 600 has a magnitude such to nullify (or at least minimize as more as possible) the offset voltage between the inverting and the non-inverting terminals when applied to the non-inverting compensation terminal of the operational amplifier 124'. The structure and the operation of the operational amplifier 124' and of the offset management circuit 600 according to an embodiment are described in detail below.

Figure 6:
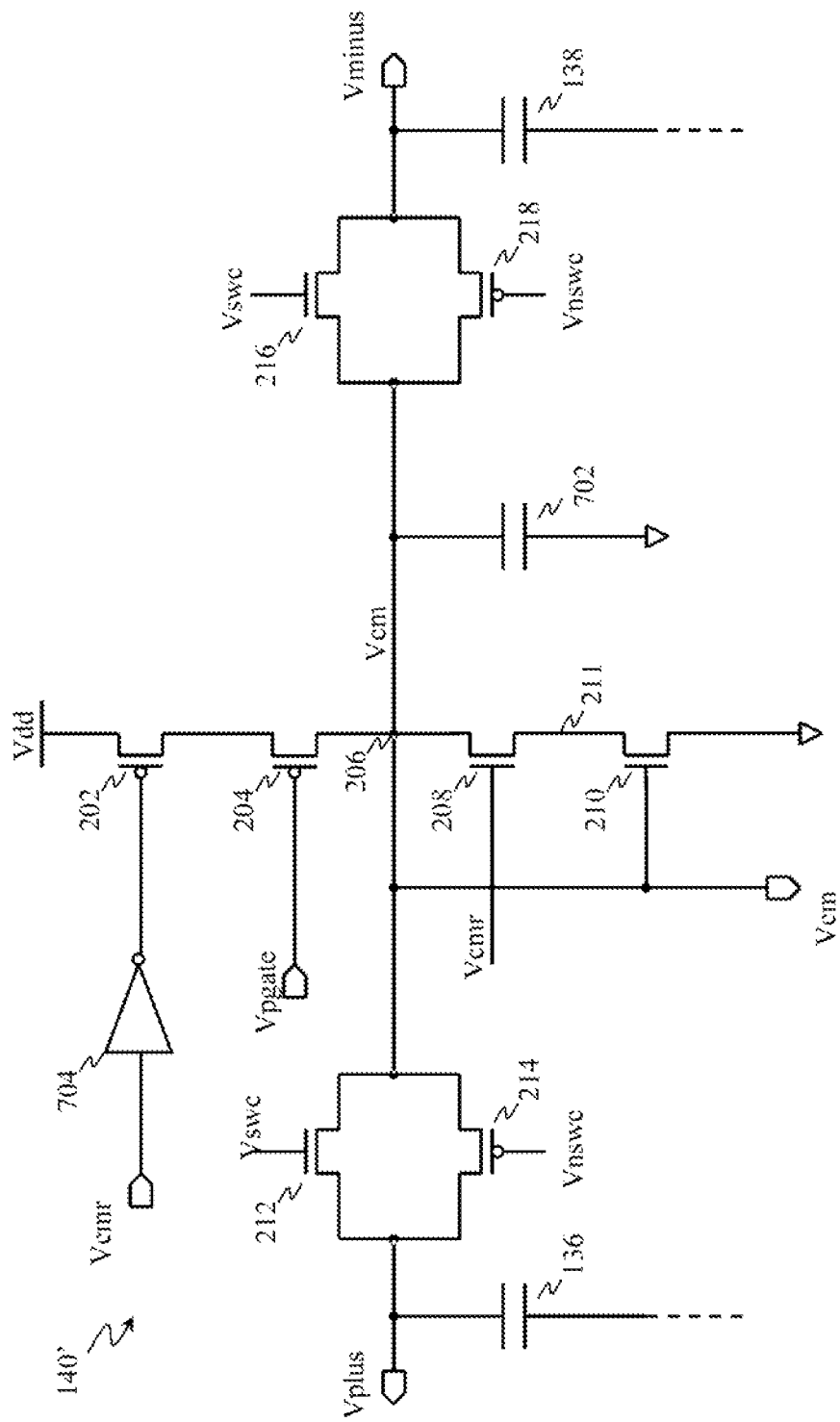
FIG. 6 illustrates the circuit structure of a biasing block in the circuit of FIG. 5 according to an embodiment.

In the circuit 100' the biasing block 140 is replaced by a biasing block 140', an embodiment of whose structure is illustrated in FIG. 6. As can be seen in this figure, the biasing block 140' is substantially equal to the biasing block 140, but has some differences. In the biasing block 140' the common mode voltage Vcm generated by the transistors 208 and 210 is stored in a capacitor 702 coupled between the circuit node 206 and a terminal providing the ground voltage, and is periodically regenerated by activating/deactivating the transistors 202 and 208 through a common-mode regeneration signal Vcmr. In particular, the common-mode regeneration signal Vcmr is supplied to the gate terminal of the transistor 208 and to an input terminal of a NOT logic gate 704; the NOT logic gate 704 has an output terminal coupled to the gate terminal of the transistor 202. When the common-mode regeneration signal Vcmr is asserted (e.g., at the supply voltage Vdd), the transistors 202 and 208 are turned on, and the biasing block 140' behaves in the same way as the biasing block 140 described in FIG. 2; when instead the common-mode regeneration signal Vcmr is deasserted (e.g., at the ground voltage), the transistors 202 and 208 are turned off, and the common mode voltage Vcm is equal to the value stored in the capacitor 702.

Figure 7:
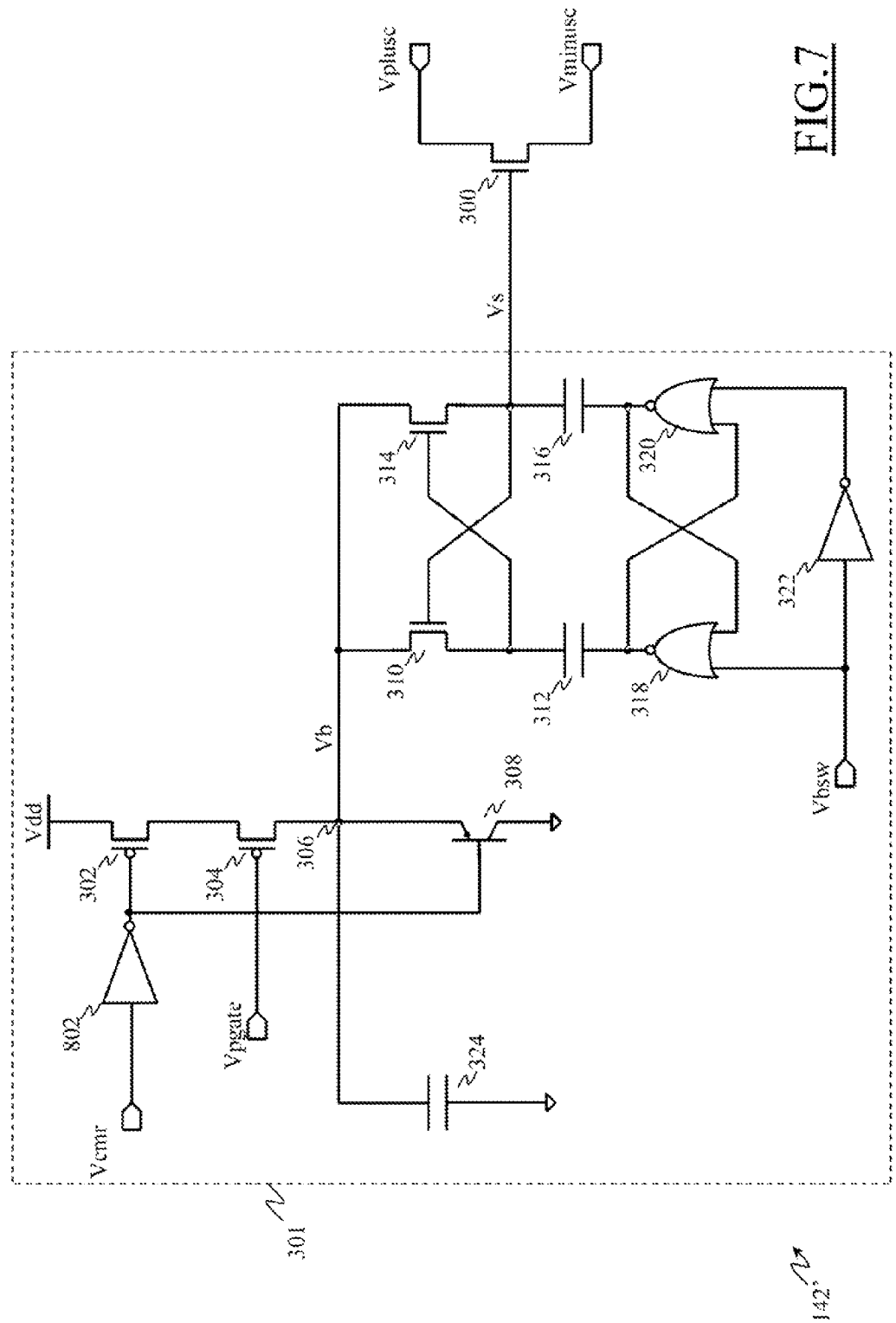
FIG. 7 illustrates the circuit structure of a short-circuit block in the circuit of FIG. 5 according to an embodiment.

Furthermore, in the circuit 100' the short-circuit block 142 is replaced by a short-circuit block 142', an embodiment of whose structure is illustrated in FIG. 7. Even in this case, the short-circuit block 142' is substantially similar to the short-circuit block 142, but has some differences. In particular, in the short-circuit block 142' the controlled switch 300 is controlled by a dedicated control signal Vbsw, different from the control signal Vswc; this makes it possible to control the short-circuit 142' and polarization 140' blocks independently. In addition, in the short-circuit block 142' the voltage Vb of the circuit node 306 may be periodically regenerated by activating/deactivating the transistors 302 and 308 via the common-mode regeneration signal Vcmr; in particular, the common-mode regeneration signal Vcmr is provided to an input terminal of a NOT logic gate 802, having an output terminal coupled to the gate terminal of the transistor 302 and to the base terminal of the transistor 308. When the common-mode regeneration signal Vcmr is asserted (for example, to the supply voltage Vdd), the transistors 302 and 308 are turned on, and the operation of the short-circuit block 142' is equal to the operation of the short-circuit block 142; when instead the common-mode regeneration signal Vcmr is deasserted (for example, at the ground voltage), the transistors 302 and 308 are turned off, and the value of the voltage Vb of the circuit node 306 is equal to the value stored in the capacitor 324.

Figure 8:
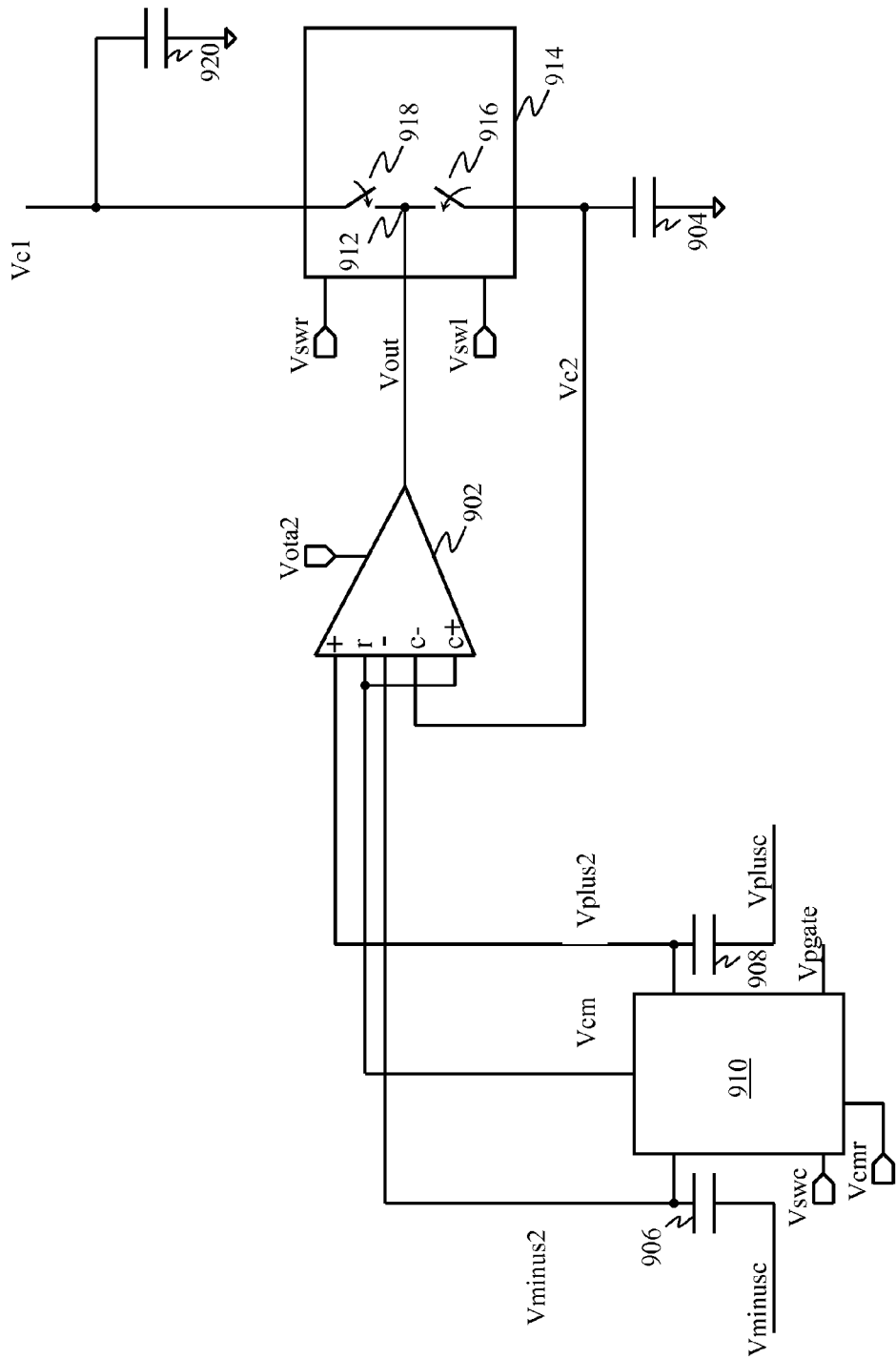
FIG. 8 shows a circuit for managing the offset in the circuit of FIG. 5 according to an embodiment.

The structure of the offset management circuit 600 according to an embodiment will now be described in greater detail with reference to FIG. 8.

The offset management circuit 600 may have a structure that is typical for the circuit class that operates according to the technique of the continuous zeroing (in the jargon, "Continuous Auto-Zeroing"). The zeroing (reduction) of the offset voltage of the operational amplifier 124' is performed by the offset management circuit 600 via the selective inclusion of an auxiliary operational amplifier 902 in the negative feedback loop of the operational amplifier 124'; in more detail, the offset management circuit 600 is configured for measuring the offset voltage of the auxiliary operational amplifier 902, storing in a capacitor 904 a compensation voltage Vc2 corresponding to the measured offset voltage, and then insert the auxiliary operational amplifier 902—compensated by means of the measured compensation voltage Vc2—in the feedback of the operational amplifier 124'. In this way, the offset voltage of the operational amplifier 124' is nullified by a negative feedback loop comprising an amplifier—the auxiliary amplifier 902—which ideally has a null voltage offset.

According to an embodiment, the auxiliary operational amplifier 902 is structured in the same way as the operational amplifier 124'—i.e., it is approximately the same as the operational amplifier 124'. In addition, the inverting and non-inverting inputs of the auxiliary amplifier 902 are supplied by input voltages corresponding to the input voltages supplied to the inverting and non-inverting inputs of the amplifier 124'.

For this reason, the offset management circuit 600 comprises a first capacitor 906 having a first terminal coupled to the emitter terminal of the transistor 116 (or to the first terminal of the capacitor 138) comprised in the reference circuit element 106 for receiving the reference voltage Vminusc, and a second capacitor 908 having a first terminal coupled to the emitter terminal of the transistor 110 comprised in the reference circuit element 102 for receiving the voltage Vplusc. The capacitor 906 comprises a second terminal coupled to an inverting terminal ("−") of the auxiliary operational amplifier 902 for providing a voltage Vminus2 corresponding to the voltage Vminus provided to the inverting terminal of the operational amplifier 124'; the capacitor 908 also comprises a second terminal coupled to a non-inverting terminal ("+") of the auxiliary operational amplifier 902 to provide a voltage Vplus2 corresponding to the voltage Vplus provided to the non-inverting terminal of the operational amplifier 124'.

To ensure that the voltages Vplus2 and Vminus2 are as equal as possible to the voltages Vplus and Vminus, the second terminals of the capacitors 906 and 908 are coupled to a biasing block 910 having approximately the same structure of the biasing block 140'. The biasing block 910 has a first terminal for receiving the control signal Vswc, a second terminal for receiving the driving voltage Vpgate, a third terminal coupled to the second terminal of the capacitor 906, a fourth terminal coupled to the second terminal of the capacitor 908, and a fifth terminal to receive the common-mode regeneration signal Vcmr. In the same way as for the biasing block 140', the biasing block 910 is adapted to generate the common-mode voltage Vcm'—corresponding to the voltage Vcm generated by the biasing block 140'—which is actually supplied to the inputs of the auxiliary operational amplifier 902; this voltage is selectively forced to the inputs of the auxiliary operational amplifier 902 according to the control signal Vswc shorting the second terminal of the capacitors 906 and 908 coupled to the inputs of the auxiliary operational amplifier 902. In this way the voltages Vplus2 and Vminus2 are brought to the value of the voltage Vcm' determined by the biasing block 910. The biasing block 910 also comprises a terminal coupled to a reference terminal ("r") of the auxiliary operational amplifier 902 in order to provide the common-mode voltage Vcm'.

Similarly to the operational amplifier 124', the auxiliary operational amplifier 902 is provided with a pair of terminals for the offset compensation, comprising a non-inverting compensation terminal ("c+") coupled to the biasing block 910 for receiving the common-mode voltage Vcm', and an inverting compensation terminal ("c−") coupled to a first terminal of the capacitor 904 for receiving the compensation voltage Vc2. The capacitor 904 comprises a second terminal coupled to a terminal that provides the ground voltage. The auxiliary operational amplifier 902 also comprises an output terminal coupled to a circuit node 912 of a switching circuit 914 to provide an output voltage Vout. The auxiliary operational amplifier 902 may be selectively activated or deactivated by means of a control signal Vota2.

The switching circuit 914 comprises a first switch 916 controlled by a driving signal Vswl having a first conduction terminal coupled to the first conduction terminal of the capacitor 904 and a second conduction terminal coupled to the circuit node 912. The switching circuit 914 also comprises a second switch 918 controlled by a driving signal Vswr having a first conduction terminal coupled to the circuit node 912 and a second conduction terminal coupled to a first terminal of a capacitor 920 for supplying the compensation voltage Vc1 to the non-inverting compensation terminal of the operational amplifier 124'. The capacitor 920 comprises a second terminal coupled to a terminal that provides the ground reference voltage.

Figure 9:
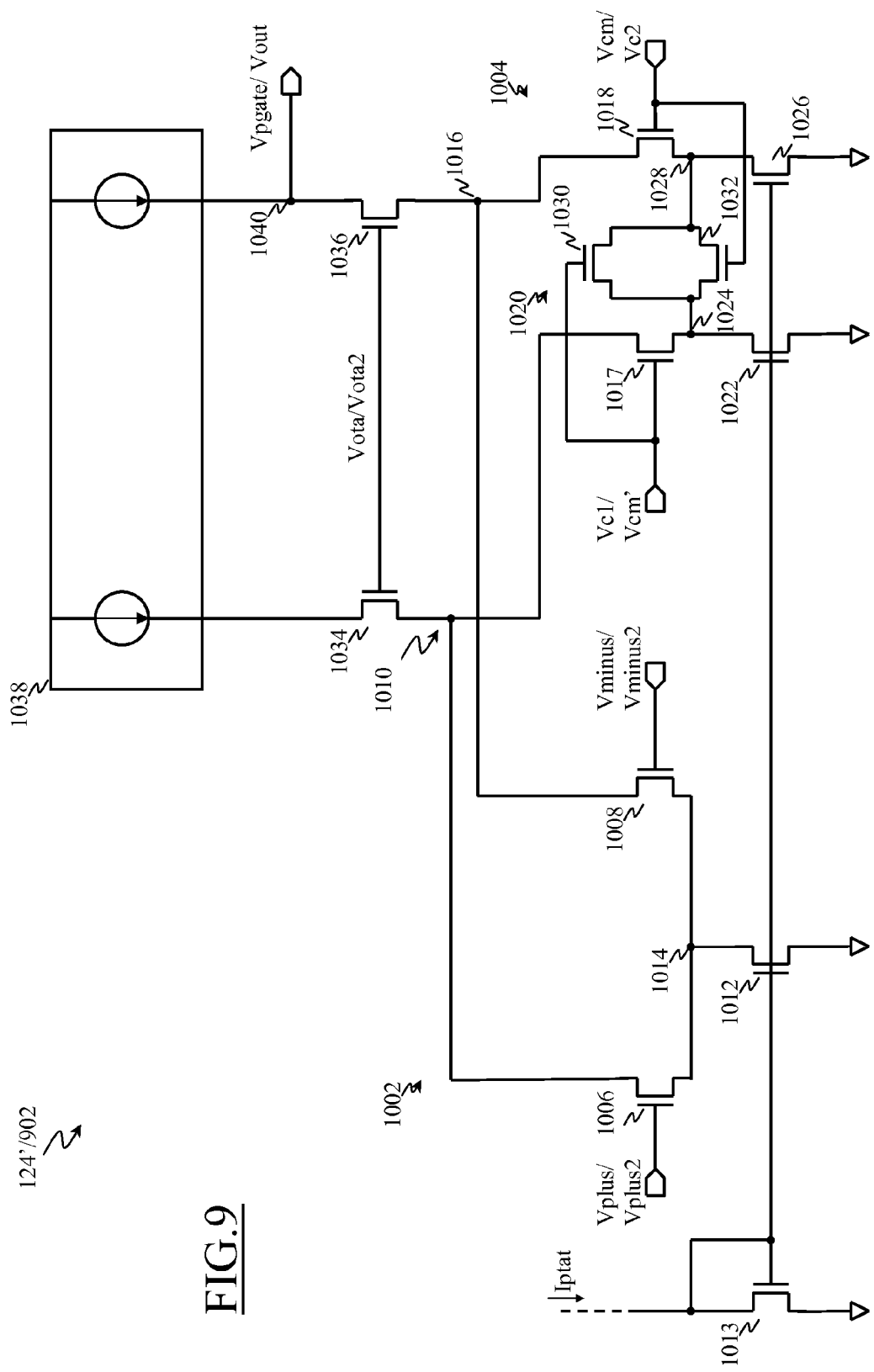
FIG. 9 shows a structure of an operational amplifier in the circuit of FIG. 5 and of an auxiliary operational amplifier in the offset management circuit of FIG. 8 according to an embodiment.

Before proceeding with the description of operation of the offset management circuit 600 and of the bandgap voltage reference 100' as a whole, a possible structure of the operational amplifier 124' and of the auxiliary operational amplifier 902 will now be described according to an embodiment shown in FIG. 9.

In particular, given that according to an embodiment the operational amplifier 124' and the auxiliary operational amplifier 902 are equal, we will refer to a single circuit structure, identified with the generic term of "amplifier". The signals provided/generated to/from terminals of the amplifier are identified in the figure with a double reference, the first of which corresponds to the operational amplifier 124' and the second of which corresponds to the auxiliary operational amplifier 902.

The amplifier 124'/902 is an offset-compensable operational amplifier that comprises two input stage 1002, 1004 coupled in parallel.

The stage 1002, called a gain stage, comprises a pair of n-channel MOS transistors 1006, 1008 coupled in differential configuration. In particular, the transistor 1006 has a drain terminal coupled to a circuit node 1010, a gate terminal which is the non-inverting terminal of the amplifier—adapted to receive the voltage Vplus/Vplus2—and a source terminal coupled to a drain terminal of an n-channel MOS transistor 1012 (circuit node 1014) adapted to provide the bias current of the transistors 1006 and 1008. The transistor 1008 has a drain terminal coupled to a circuit node 1016, a gate terminal which is the inverting terminal of the amplifier—adapted to receive the voltage Vminus/Vminus2—and a source terminal coupled to the node 1014. The transistor 1012 has a source terminal coupled to a terminal providing the ground voltage and a gate terminal coupled to gate terminal of a further n-channel MOS transistor 1013. The transistor 1013 has a source terminal coupled to a terminal that provides the ground voltage and a drain terminal coupled to the gate terminal. The transistor 1013 is configured to conduct a current approximately equal to the current Iptat; this current may for example be provided to the transistor 1013 by a current generator mirrored to one of the current generators 104 and 108 of the circuit 100'.

The stage 1004, called a compensation stage, comprises a further pair of n-channel MOS transistors 1017, 1018 coupled in a degenerated differential configuration, i.e., with the source terminals coupled together through a degeneration resistor 1020. In particular, the transistor 1017 has a drain terminal coupled to the circuit node 1010, a gate terminal that represents the non-inverting compensation terminal of the amplifier—adapted to receive the voltage Vc1/Vcm'—and a source terminal coupled to a drain terminal of a n-channel MOS transistor 1022 (circuit node 1024) adapted to provide the bias current of the transistor 1017. The transistor 1018 has a drain terminal coupled to the circuit node 1016, a gate terminal which is the inverting compensation terminal of the amplifier—adapted to receive the voltage Vcm/Vc2—and a source terminal coupled to a drain terminal of an n-channel MOS transistor 1026 (circuit node 1028) adapted to provide the bias current of the transistor 1018. The transistors 1022 and 1026 have a source terminal coupled to a terminal providing the ground voltage and a gate terminal coupled to the gate terminal of transistor 1013. The degeneration resistor 1020 is formed by a pair of n-channel MOS transistors 1030 and 1032 configured to operate in the triode operating region. In particular, the transistor 1030 has a first conduction terminal coupled to the node 1024, a second conduction terminal coupled to the node 1028, and a gate terminal coupled to the gate terminal of the transistor 1017 to receive the voltage Vc1/Vcm'. The transistor 1032 has a first conduction terminal coupled to the node 1024, a second conduction terminal coupled to the node 1028, and a gate terminal coupled to the gate terminal of the transistor 1018 in order to receive the voltage Vcm/Vc2.

The circuit node 1010 is coupled to a source terminal of a n-channel MOS transistor 1034, while the circuit node 1016 is coupled to a source terminal of a n-channel MOS transistor 1036. The transistor 1034 has a gate terminal coupled to a transistor 1036 gate terminal and adapted to receive the control signal Vota/Vota2, and a drain terminal coupled to a current generator 1038 controlled at its gate terminal by the control signal Vota/Vota2. The transistor 1036 has its drain terminal coupled to the current generator 1038 (circuit node 1040). Circuit node 1040 represents the output node of the amplifier, adapted to provide the voltage Vpgate/Vout.

The operational amplifier above described may be selectively activated/deactivated by turning on/off the transistors 1034, 1036 and the current generator 1038 through the control signal Vota/Vota2.

Being equipped with a couple of input stages in parallel, the amplifier may be operated in standard mode, i.e., by activating the gain stage 1002 via input signals Vplus/Vplus2, Vminus/Vminus2 applied differentially and by turning off the compensation stage 1004, or in a compensated mode, by turning on also the compensations stage 1004 via compensation voltages Vc1/Vcm', Vcm/Vc2 applied differentially. By applying proper compensation voltages Vc1/Vcm', Vcm/Vc2, it may be possible to nullify (or at least reduce) the magnitude of the offset voltage of the amplifier.

Without descending into technical details that go beyond the scope of the present disclosure, the presence of the degeneration resistor 1020 allows one to decrease the gain of the compensation stage 1004 by a quantity so as to stabilize the amplifier when coupled in negative feedback.

Figure 10:
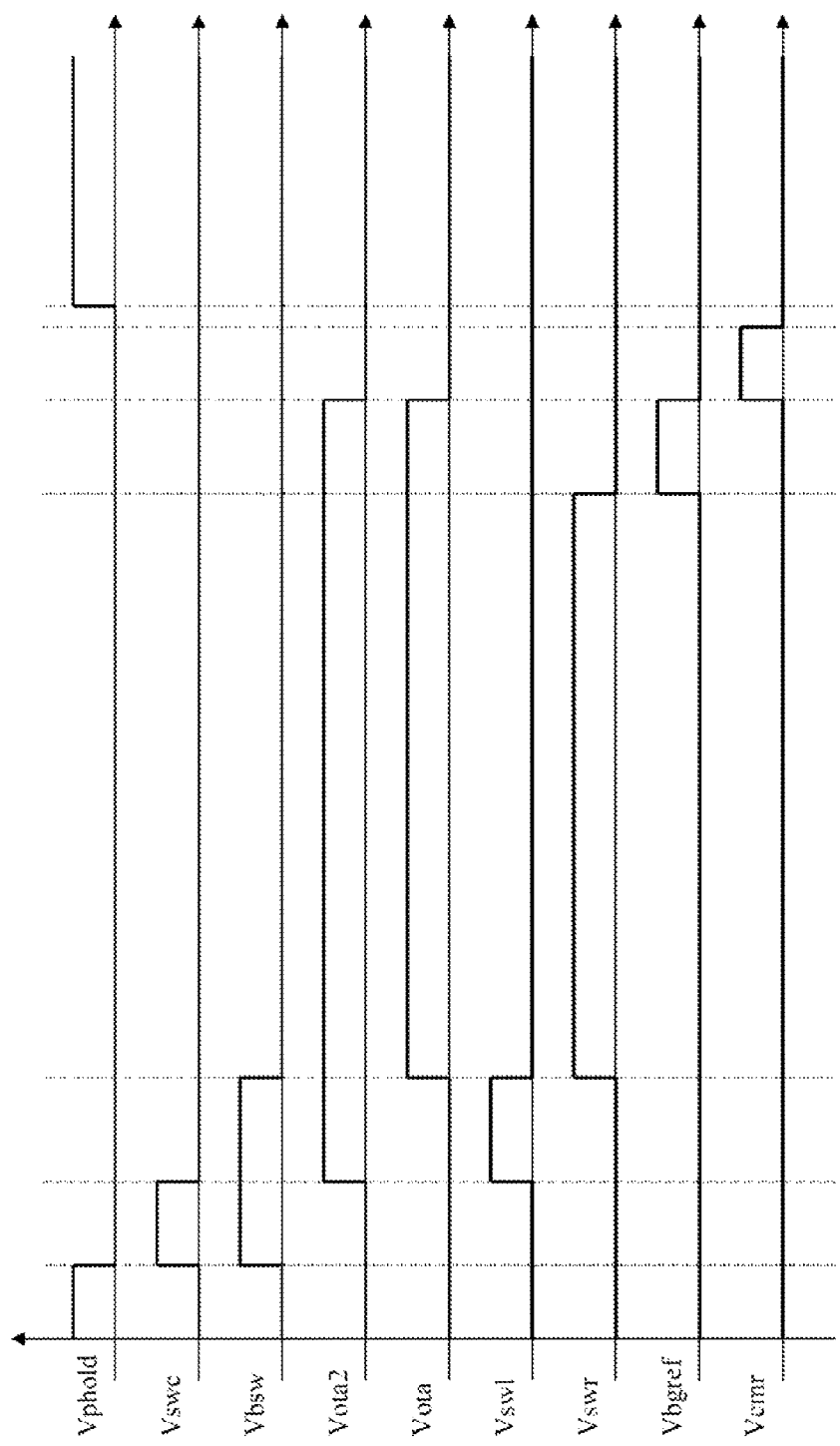
FIG. 10 is a timing diagram that shows the evolution over time of some of the signals generated and received by an embodiment of the circuit of FIG. 5.

The offset management circuit 600 operation and a bandgap voltage reference circuit 100' as a whole will be now described with reference to the FIGS. 6-9, previously described, in conjunction with FIG. 10; FIG. 10 is a time diagram which shows the trend over time of some of the signals generated/received by the circuit 100'.

As the circuit 100, the circuit 100' as well has an architecture of the "sample and hold" type, whose operation comprises a sequence of alternating holding phases and regeneration phases timed by the value assumed by the holding signal—in particular, during the holding phases the hold signal Vphold is at a high voltage level, while during the regeneration phases said signal is at a low voltage level.

During the holding phase (hold signal Vphold at the high voltage level), the current generators 104, 108, 126 of the circuit 100' are turned off; moreover the control voltages Vota and Vota2 are deasserted to a low voltage (ground voltage), so that even the operational amplifiers 124' and 902 are turned off. During each holding phase, the value of the bandgap voltage Vbg is equal to that corresponding to the charge that was stored in the capacitor 148 during the previous regeneration phase; similarly, the value of the driving voltage Vpgate is equal to the value corresponding to the charge which was stored in the capacitor 144 during the previously holding phase, set in turn by a previous activation of the operational amplifier 124'.

At the start of the regeneration phase, the hold signal Vphold is reduced to low voltage level, turning on the transistors 114, 122 and 132 and thus enabling the current generators 104, 108, 126 to the generation of the current Iptat in the various branches of the circuit.

The control signals Vswc and Vbsw are then brought to a high voltage level (Vdd) to turn on the biasing blocks 140', 910 and to activate the short-circuit block 142' so as to regenerate the values of the voltages across the capacitors 136 and 138 coupled to the operational amplifier 124', and the voltages across the capacitors 906 and 908 coupled to the auxiliary operational amplifier 902. In particular, the transmission ports of the biasing block 140' are closed, shorting the second terminal of the capacitor 136 with the second terminal of the capacitor 138; simultaneously, the controlled switch of the short-circuit block 142' as well is closed, in order to short-circuit the emitter terminal of the transistor 110 (coupled to the first terminal of the capacitor 136) with the emitter terminal of the transistor 116 (coupled to the capacitor 138 first terminal through the resistor 118 or with the first terminal of the capacitor 138 directly). In this situation, the voltage Vplus at the non-inverting terminal of the operational amplifier 124' and the voltage Vminus at the inverting terminal of the operational amplifier 124' are brought to the common-mode voltage Vcm stored across the capacitor 702 of the biasing block 140', while a voltage drop equal to dVc:

$$dVc=(Vcm-Veb),$$

is set on the capacitors 136 and 138, where Veb=Vplusc=Vminusc. Similarly, the transmission gates of the biasing block 910 are closed, shorting the second terminal of the capacitor 906 with the second terminal of the capacitor 908. In this situation, the voltage Vplus2 at the non-inverting terminal of the auxiliary operational amplifier 902 and the voltage Vminus2 at the inverting terminal of the auxiliary operational amplifier 902 are brought to the common-mode voltage Vcm' taken from the biasing block 910, while on the capacitor 906 and 908 it is set a voltage drop dVc' equal to:

$$dVc=(Vcm'-Veb),$$

where Veb=Vplusc=Vminusc.

The common mode voltages at the inputs of the operational amplifier 124' and of the auxiliary operational amplifier 902 are then set to a value, which may be an optimal value, and which follows the possible temperature and biasing variation to which the circuit 100' is subject, and that appears to be calibrated depending on the specific parameters of the process by which the circuit 100' was manufactured.

Subsequently, the control signal Vswc is brought to a low voltage level (ground voltage), so that the transmission gates of the biasing blocks 140' and 910 are open.

At this point begins the compensation phase of the offset voltage of the auxiliary operational amplifier 902. In particular, the control signal Vota2 is asserted to a high voltage level (Vdd) to turn on the auxiliary operational amplifier 902, and in the meanwhile the driving signal Vswl is asserted as well to close the switch 916 of the switching circuit 914. Consequently, the inverting and non-inverting input terminals of the auxiliary operational amplifier 902 are shortened together through the capacitors 906 and 908 (which have the first terminals shortened together because the short-circuit block 142' is still active); moreover, the auxiliary operational amplifier 902 has the output terminal coupled in feedback with the inverting compensation terminal, and the non-inverting compensation terminal that receives from the biasing block 910 the common-mode voltage Vcm'. In this condition, the compensation voltage Vc2 across the capacitor 904 assumes a value adapted to compensate the offset voltage of the auxiliary operational amplifier 902. Such offset voltage corresponds to a condition of the auxiliary operational amplifier 902 in which the inverting and non-inverting input terminals have a common-mode voltage equal to the common-mode voltage Vcm' (which in turn corresponds to the common-mode voltage Vcm of the input terminals of the operational amplifier 124').

Subsequently, the control signal Vsbw is deasserted to a low voltage level (the ground voltage) to turn off the compensation block 142' and interrupt the coupling between the first terminal of the capacitor 136 and the first terminal of the capacitor 138, and between the first terminal of the capacitor 906 and the first terminal of the capacitor 908.

In the same time, the control signal Vota is asserted to a high voltage level (Vdd) to turn on the operational amplifier 124' and to enable the negative feedback loop between the voltage across the reference circuit elements 102, 106 and the driving voltage Vpgate of the current generators 104, 108 and 106. In particular, the driving voltage Vpgate across the capacitor 144 is regenerated by the operational amplifier 124' according to the values assumed by the voltages Vplus and Vminus.

Furthermore, the driving signal Vswl is deasserted to open the switch 916, while the driving signal Vswr is asserted to close the switch 918 of the switching circuit 914. In this condition, the output terminal of the auxiliary operational amplifier 902 is placed in coupling with the non-inverting compensation terminal of the operational amplifier 124' to provide the compensation voltage Vc1, which is stored across the capacitor 920. Consequently, the auxiliary operational amplifier 902—whose offset voltage appears to be compensated because the compensation voltage Vc2 stored across the capacitor 904 is provided to the inverting compensation input terminal—is inserted into the feedback loop generated by the operational amplifier 124' between the voltage across the reference circuit elements 102, 106 and the driving voltage Vpgate. Providing to the non-inverting terminal of the operational amplifier 124' the compensated voltage Vc1 generated by the presence of the auxiliary operational amplifier 902 in the feedback loop, the offset voltage may be reduced, since the voltages Vminusc and Vplusc are forced to assume a value substantially equal to each other; therefore the current Iptat may assume a value close to the ideal value (i.e. corresponding to a null voltage offset). In the occurrence that the auxiliary operational amplifier 902 is equal to the operational amplifier 124', and the common-mode voltage Vcm' generated by the biasing block 910 is equal to the common-mode voltage Vcm generated by the biasing block 140', the offset voltages of the two amplifiers would be equal, and the compensation voltage Vc2 would be equal to the compensation voltage Vc1 Consequently, the offset voltage of the operational amplifier 124' is approximately completely nullified, because at the non-inverting compensation terminal of the operational amplifier 124' would be applied a compensation voltage Vc1 equal to the compensation voltage Vc2 used to compensate the offset voltage of the auxiliary operational amplifier 902 which generates the compensation voltage Vc1 itself. Analyzing the topology of the circuit 100' it is noted that to establish a correct negative feedback loop in an embodiment, the compensation voltage Vc1 is provided to the non-inverting compensation terminal of the operational amplifier 124', and not to the inverting compensation terminal.

Subsequently, the auxiliary operational amplifier 902 is removed from the negative feedback loop of the operational amplifier 124' by deasserting the driving signal Vswr and then opening the switch 918. The compensation voltage Vc1 is still stored across the capacitor 920.

The sampling signal Vbgref is thus brought to a high voltage level (Vdd) for closing the controlled switch 146 in order to regenerate the bandgap voltage Vbg across the capacitor 148.

Then, both the sampling signal Vbgref and the control signals Vota and Vota2 are brought to a low voltage level (the ground voltage) in order to open the controlled switch 146 and to disable the operational amplifier 124' and the auxiliary operational amplifier 902. The voltages Vbg and Vpgate are then stored in the capacitors 148 and 144.

Before proceeding to the subsequent holding phase, the common-mode regeneration signal Vcmr is asserted to a high voltage level (Vdd) to activate the transistor 202 of the biasing block 140' and then regenerate the common-mode voltage Vcm across the capacitor 702 (similar considerations can be applied to the biasing block 910 and the common-mode voltage Vcm'), and to activate the transistors 302 and 308 of the short-circuit block 142' and then regenerate the voltage Vb across the capacitor 324.

At this point the holding signal Vphold is brought to a high voltage level (Vdd), and the new holding phase starts.

In summary, an embodiment of the circuit 100' is able to set an optimum common-mode voltage, suitable for applications with low supply voltages and that is not affected by unwanted variations due to the presence of an offset voltage at the input of the operational amplifier; furthermore, thanks to the architecture of the "sample and hold" type used, the current consumption is substantially reduced compared to solutions known in the art.

Naturally, in order to satisfy local and specific requirements, one may apply to the embodiments described above many modifications. Particularly, although the present disclosure has been described with a certain degree of particularity with reference to embodiments thereof, it should be understood that various omissions, substitutions and changes in the form and details as well as other embodiments are possible; moreover, it is expressly intended that specific elements and/or method steps described in coupling with any disclosed embodiment may be incorporated in any other embodiment as a general matter of design choice.

For example, similar considerations apply if the reference circuit elements have a different but equivalent structure, such as the presence in at least one reference circuit element of more bipolar transistors coupled in parallel to each other.

Moreover, even if the described current generators were sized to mirror the generated current with a mirror ratio equal to 1:1, the concepts of the present disclosure may be applied to cases with different mirroring ratios.

In addition, the common mode voltage generated by the biasing block may be achieved in other ways, such as using a single transistor sufficiently resistive to allow the transistors of the operational amplifier input stage to operate in the saturation zone.

Similar considerations may apply to the driver circuit of the short-circuit block, which may have a different circuit structure, such as a boost circuit that does not belong to the category of the clock booster circuits.

Furthermore, some of the circuitry described above in conjunction with the embodiments of FIGS. 6-9 may be conceptual for the explanation of concepts; but the actual circuitry may be implemented differently.

Moreover, the compensation signal Vc1 may be coupled to one of the signal input terminals of the amplifier 124', thus allowing one to omit the compensation terminals.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
a first branch operable to generate a first current;
a second branch operable to generate a second current;
an amplifier having a first amplifier input node coupled to the first branch, a second amplifier input node coupled to the second branch, an amplifier output node coupled to the first and second branches, and a first compensation node that is different than the first and second amplifier input nodes;
a compensation unit operable to provide a first offset compensation signal to the first compensation node; and
a first bias unit operable to provide first and second bias signals to the first and second amplifier input nodes, respectively, such that the amplifier is operable to cause the first current to approximately equal the second current.

2. The circuit of claim 1, further comprising:
first and second supply nodes; and
wherein one of the first and second branches comprises:
a first transistor having a control node coupled to the output node of the amplifier, having a first conduction node coupled to the first supply node, and having a second conduction node; and
a second transistor configured as a diode and having a first conduction node coupled to the second conduction node of the first transistor and having a second conduction node coupled to the second supply node.

3. The circuit of claim 1, further comprising:
first and second supply nodes; and
wherein one of the first and second branches comprises:
a first transistor having a control node coupled to the output node of the amplifier, having a first conduction node coupled to the first supply node, and having a second conduction node;
an impedance element having a first node coupled to the second conduction node of the first transistor and having a second node; and
a second transistor configured as a diode and having a first conduction node coupled to the second node of the impedance element and having a second conduction node coupled to the second supply node.

4. The circuit of claim 1 wherein:
the amplifier comprises a differential input stage including:
first and second supply nodes;
a first transistor having a control node coupled to the first amplifier input node, a first conduction node coupled to the first supply node, and a second conduction node;
a second transistor having a control node coupled to the second amplifier input node, a first conduction node coupled to the first supply node, and a second conduction node coupled to the second conduction node of the first transistor;
a third transistor having a control node, a first conduction node coupled to the second conduction nodes of the first and second transistors, and a second conduction node coupled to the second supply node, the third transistor operable to conduct a third current that is approximately equal to the sum of the first current and to the second current; and
the first bias unit is operable to provide the first and second bias signals having respective values such that the third transistor is operable in a region wherein the third current is approximately independent of a voltage across the first and second conduction nodes of the third transistor.

5. The circuit of claim 1 wherein the amplifier comprises:
a differential input stage including:
first and second supply nodes;
a first transistor having a control node coupled to the first amplifier input node, a first conduction node coupled to the first supply node, and a second conduction node;
a second transistor having a control node coupled to the second amplifier input node, a first conduction node coupled to the first supply node, and a second conduction node coupled to the second conduction node of the first transistor; and
a third transistor having a control node, a first conduction node coupled to the second conduction nodes of the first and second transistors, and a second conduction node coupled to the second supply node; and
a second bias unit coupled to the control node of the third transistor and operable to cause the third transistor to conduct a third current that is approximately equal to twice one of the first and second currents.

6. The circuit of claim 1 wherein the first and second branches are respectively operable to generate the first and second currents to be approximately proportional to temperature.

7. The circuit of claim 1, further comprising a reference generator operable to generate a reference signal in response to one of the first and second currents.

8. The circuit of claim 1, further comprising:
wherein the first and second branches are respectively operable to generate the first and second currents to be approximately proportional to temperature;
a third branch coupled to the amplifier output node, operable to conduct a third current, and operable to convert the third current into a reference voltage that is approximately independent of temperature; and
wherein the first bias unit is operable to provide the first and second bias signals such that the amplifier is operable to cause the third current to be approximately equal to the first current and to be approximately equal to the second current and to be approximately proportional to temperature.

9. The circuit of claim 1 wherein the first offset compensation signal is operable to reduce an offset component of an output signal on the amplifier output node.

10. The circuit of claim 1 wherein:
the amplifier comprises a second compensation node; and
the first bias circuit is operable to provide one of the first and second bias signals to the second compensation node.

11. A circuit, comprising:
a first branch operable to generate a first current;
a second branch operable to generate a second current;
an amplifier having a first amplifier input node coupled to the first branch, a second amplifier input node coupled to the second branch, an amplifier output node coupled to the first and second branches, and a first compensation node;
a compensation unit operable to provide a first offset compensation signal to the first compensation node; and
a first bias unit operable to provide first and second bias signals to the first and second amplifier input nodes, respectively, such that the amplifier is operable to cause the first current to approximately equal the second current;
wherein the first bias unit comprises:
a first capacitor having a first node coupled to the first branch and having a second node coupled to the first amplifier input node; and
a second capacitor having a first node coupled to the second branch and having a second node coupled to the second amplifier input node.

12. The circuit of claim 11 wherein the first compensation node comprises one of the first and second amplifier input nodes.

13. A circuit, comprising:
a first branch operable to generate a first current;
a second branch operable to generate a second current;
an amplifier having a first amplifier input node coupled to the first branch, a second amplifier input node coupled to the second branch, an amplifier output node coupled to the first and second branches, and a first compensation node;
a compensation unit operable to provide a first offset compensation signal to the first compensation node; and
a first bias unit operable to provide first and second bias signals to the first and second amplifier input nodes, respectively, such that the amplifier is operable to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and
a bias generator operable to cause the first capacitor to store a first bias voltage and operable to cause the second capacitor to store a second bias voltage.

14. A circuit, comprising:
a first branch operable to generate a first current;
a second branch operable to generate a second current;
an amplifier having a first amplifier input node coupled to the first branch, a second amplifier input node coupled to the second branch, an amplifier output node coupled to the first and second branches, and a first compensation node;
a compensation unit operable to provide a first offset compensation signal to the first compensation node; and
a first bias unit operable to provide first and second bias signals to the first and second amplifier input nodes, respectively, such that the amplifier is operable to cause the first current to approximately equal the second current;
wherein the first bias unit comprises:
a first capacitor having a first node coupled to the first branch and having a second node coupled to the first amplifier input node;

a second capacitor having a first node coupled to the second branch and having a second node coupled to the second amplifier input node; and a bias generator operable to cause the first capacitor to store a first bias voltage and operable to cause the second capacitor to store approximately the first bias voltage.

15. An integrated circuit, comprising:
a first circuit, comprising:
   a first branch operable to generate a first current;
   a second branch operable to generate a second current;
   an amplifier having a first amplifier input node coupled to the first branch, a second amplifier input node coupled to the second branch, an amplifier output node coupled to the first and second branches, and a first compensation node separate from the amplifier output node;
   a compensation unit operable to provide a first offset compensation signal to the first compensation node; and
   a first bias unit operable to provide first and second bias signals to the first and second input nodes, respectively, such that the amplifier is operable to cause the first current to approximately equal the second current; and
a second circuit operable to receive a signal derived from one of the first and second currents.

16. The integrated circuit of claim 15 wherein:
the second circuit is operable to receive a reference voltage as the signal derived from one of the first and second currents;
the first and second branches are operable to generate the first and second currents approximately proportional to temperature; and
the first circuit further comprises a reference generator operable to generate the reference voltage approximately independent of temperature in response to one of the first and second currents.

17. A system, comprising:
a first integrated circuit, comprising:
   a first circuit, comprising:
      a first branch operable to generate a first current;
      a second branch operable to generate a second current;
      an amplifier having a first amplifier input node coupled to the first branch, a second amplifier input node coupled to the second branch, an amplifier output node coupled to the first and second branches, and a first compensation node separate from the amplifier output node;
      a compensation unit operable to provide a first offset compensation signal to the first compensation node; and
      a first bias unit operable to provide first and second bias signals to the first and second input nodes, respectively, such that the amplifier is operable to cause the first current to approximately equal the second current; and
   a second circuit operable to receive a signal derived from one of the first and second currents; and
a second integrated circuit coupled to the first integrated circuit.

18. The system of claim 17 wherein one of the first and second integrated circuits comprises a processor.

19. The system of claim 17 wherein the first and second integrated circuits are disposed on a same die.

20. The system of claim 17 wherein the first and second integrated circuits are disposed on respective dies.

21. A method, comprising:
generating first and second currents in response to an amplifier;
shifting voltages, corresponding to the first and second currents, via respective capacitive elements;
reducing an offset of the amplifier; and
biasing input nodes of the amplifier such that the amplifier causes the first current to approximately equal the second current.

22. The method of claim 21 wherein generating the first and second currents comprises:
generating the first current in response to a first base-emitter voltage;
generating the second current in response to a second base-emitter voltage.

23. The method of claim 21 wherein generating the first and second currents comprises generating each of the first and second currents proportional to a difference between two base emitter voltages.

24. The method of claim 21 wherein biasing the amplifier input nodes comprises superimposing a bias signal on an input signal to one of the amplifier input nodes.

25. The method of claim 21 wherein biasing the input nodes comprises biasing the input nodes such that a transistor of the amplifier operates in a region where a current conducted by the transistor is relatively independent of a voltage across conduction nodes of the transistor.

26. The method of claim 21 wherein generating the first and second currents comprises generating the first and second currents proportional to temperature.

27. The method of claim 21, further comprising generating a band-gap reference voltage in response to one of the first and second currents.

28. The method of claim 21 wherein reducing the offset of the amplifier comprises compensating an input offset of the amplifier to reduce an output offset of the amplifier.

29. The method of claim 21 wherein reducing the offset of the amplifier comprises providing an offset compensation signal to one of the input nodes of the amplifier.

30. The method of claim 21 wherein reducing the offset of the amplifier comprises providing an offset compensation signal to a compensation node of the amplifier.

31. A method, comprising:
generating first and second currents in response to an amplifier;
reducing an offset of the amplifier; and
biasing input nodes of the amplifier such that the amplifier causes the first current to approximately equal the second current;
wherein biasing the input nodes of the amplifier comprises:
rendering the amplifier unable to cause the first current to approximately equal the second current; and
generating a bias signal for one of the amplifier input nodes while rendering the amplifier unable to cause the first current to approximately equal the second current.

32. A method, comprising:
generating first and second currents in response to an amplifier;
reducing an offset of the amplifier; and
biasing input nodes of the amplifier such that the amplifier causes the first current to approximately equal the second current;
wherein:
biasing the amplifier input nodes comprises superimposing a bias signal on an input signal to one of the amplifier input nodes; and reducing the offset of the amplifier comprises providing the bias signal to a first compensation node of the amplifier and providing a compensation signal to a second compensation node of the amplifier.

* * * * *